US008823254B2

United States Patent
Ohta et al.

(10) Patent No.: US 8,823,254 B2
(45) Date of Patent: Sep. 2, 2014

(54) DISPLAY PANEL APPARATUS AND MANUFACTURING METHOD OF DISPLAY PANEL APPARATUS

(75) Inventors: Takashi Ohta, Kyoto (JP); Masahiro Kasano, Osaka (JP); Kenji Okumoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 261 days.

(21) Appl. No.: 13/466,408

(22) Filed: May 8, 2012

(65) Prior Publication Data
US 2012/0218173 A1    Aug. 30, 2012

Related U.S. Application Data

(63) Continuation of application No. PCT/JP2010/002364, filed on Mar. 31, 2010.

(51) Int. Cl.
| H01L 51/00 | (2006.01) |
| H01L 51/52 | (2006.01) |
| G02B 3/00  | (2006.01) |
| G02B 27/10 | (2006.01) |
| H01L 27/32 | (2006.01) |

(52) U.S. Cl.
CPC ........ H01L 51/5275 (2013.01); H01L 51/5284 (2013.01); *H01L 51/5253* (2013.01); G02B 3/0056 (2013.01); G02B 27/1046 (2013.01); *H01L 27/3211* (2013.01); G02B 3/0068 (2013.01)
USPC .......................................... 313/503; 313/512

(58) Field of Classification Search
CPC .................................................... H01L 27/288
USPC ...................... 313/498–512; 257/90; 428/490
See application file for complete search history.

(56) References Cited

U.S. PATENT DOCUMENTS

| 5,555,476 A  | 9/1996 | Suzuki et al. |
| 7,081,912 B2 | 7/2006 | Seki et al.   |

(Continued)

FOREIGN PATENT DOCUMENTS

| JP | 58-049903 | 3/1983 |
| JP | 07-072809 | 3/1995 |

(Continued)

OTHER PUBLICATIONS

U.S. Appl. No. 13/466,470 to Takashi Ohta, which was filed on May 8, 2012.
U.S. Appl. No. 13/476,378 to Takashi Ohta, which was filed on May 21, 2012.
International Search Report in PCT/JP2010/002364, dated Apr. 27, 2010.

*Primary Examiner* — Anne Hines
(74) *Attorney, Agent, or Firm* — Greenblum & Bernstein, P.L.C.

(57) ABSTRACT

A display panel apparatus includes pixels. Each pixel includes an organic luminescent layer between an upper electrode and a lower electrode and is configured to emit a red, a green, or a blue light. A glass substrate is above the upper electrode. A lens sheet is between the pixels and the glass substrate and includes lenses and a base. Each lens corresponds to a pixel and protrudes from the base. Partitions are between the glass substrate and the lens sheet for partitioning the lenses. The partitions have a first height that is greater than a second height of the lenses. The base includes trenches between the lenses. The trenches are recessed in a direction opposite the lenses. The partitions are in the trenches. Each partition has a cross-section that includes an upper side that has a different length than a bottom side and lateral sides that are tilted.

25 Claims, 12 Drawing Sheets

(56) References Cited

U.S. PATENT DOCUMENTS

| | | |
|---|---|---|
| 7,116,484 B2 | 10/2006 | Nemoto et al. |
| 7,242,526 B2 | 7/2007 | Nemoto et al. |
| 7,733,019 B2 | 6/2010 | Song et al. |
| 7,878,670 B2 * | 2/2011 | Shibasaki et al. ............ 362/84 |
| 2004/0021762 A1 | 2/2004 | Seki et al. |
| 2005/0002105 A1 | 1/2005 | Nemoto et al. |
| 2005/0231085 A1 | 10/2005 | Song et al. |
| 2006/0262412 A1 | 11/2006 | Nemoto et al. |
| 2007/0077349 A1 | 4/2007 | Newman et al. |
| 2007/0241469 A1 | 10/2007 | Nemoto et al. |

FOREIGN PATENT DOCUMENTS

| | | |
|---|---|---|
| JP | 2003-100444 | 4/2003 |
| JP | 2003-291404 | 10/2003 |
| JP | 2004-317559 | 11/2004 |
| JP | 2005-037884 | 2/2005 |
| JP | 2005-310749 | 11/2005 |
| JP | 2006-059544 | 3/2006 |
| JP | 2009-510696 | 3/2009 |

* cited by examiner

LN  BNK  12(12R)  12(12G)  12(12B)

DISPLAY PANEL APPARATUS AND MANUFACTURING METHOD OF DISPLAY PANEL APPARATUS

CROSS REFERENCE TO RELATED APPLICATION

This is a continuation application of PCT Application No. PCT/JP10/002364 filed on Mar. 31, 2010, designating the United States of America, the disclosure of which, including the specification, drawings and claims, is incorporated herein by reference in its entirety.

BACKGROUND OF THE INVENTION

1. Field of the Invention

The present invention relates to a display panel apparatus and its manufacturing method.

2. Description of the Related Art

In recent years, there has been growing demand for flat panel displays (FPD) as a space-saving apparatus that allow users to enjoy large-screen images. Among the FPDs, the display panel apparatus including an organic electro-luminescence (EL) device is a next-generation panel technology expected to reduce the thickness, increase the image quality of the FPDs and reduce manufacturing cost for the FPDs.

Conventionally, the organic EL display panel with a top-emission structure has been reviewed. As one example, an organic EL display panel that consists of a circuit substrate including a thin-film transistor, a luminescent unit including a luminescent layer interposed between electrodes, a lens layer for increasing the light-extraction efficiency to outside of the panel, and a glass substrate as a protection material formed in this order from the bottom of the panel has been proposed. In addition, in this organic EL display panel, panels are partitioned for each pixel, and the pixel is divided into luminescent areas each emits red, green, or blue light, that is, the light's three primary colors in one pixel.

In the organic EL display panel, part of the light emitted at the luminescent layer transmits each of the layers and reaches outside of the panel. There are several paths for the light emitted from the luminescent layer to reach outside of the organic EL panel. For example, the light emitted at the luminescent layer transmits the lens layer and the glass substrate above the luminescent layer, exits to outside of the organic panel. In addition, for example, the light emitted at the luminescent layer propagates below the luminescent layer, and reflects on the repeller which is a lowermost layer of the luminescent part. Afterwards, there is a path that the light reflected on the repeller transmits the lens layer and the glass substrate which are above the luminescent layer and reaches outside of the organic EL display panel. As such, there are several paths for the emitted light to pass through.

SUMMARY OF THE INVENTION

However, the conventional technology causes the following problems.

More specifically, when the light exits to outside the organic EL display panel, the light propagates from the luminescent portion to the glass substrate in the uppermost layer of the panel regardless of the path to be taken. In addition, at the interface between the bonding layer for bonding the glass substrate and the glass substrate, and the interface between the glass substrate and air, the light reflects and the reflected light returns to the inside of the panel. Thus, the reflected light enters the adjacent luminescent area in different color. The light that entered the luminescent area in different color is reflected on the repeller which is the lowermost layer of the luminescent part. Subsequently, the light reflected on the repeller transmits the luminescent layer and others, and radiated to outside of the organic EL display panel from the pixel unit different from the original luminescent pixel.

As such, the colors of the luminescent light emitted in a luminescent area and the light emitted in a luminescent are adjacent to the area are mixed, making it difficult to display bright-colored image.

In order to solve the above-mentioned problem, the organic EL display panel apparatus according to an aspect of the present invention is a display panel apparatus including: pixel units having lower electrode, an upper electrode, and organic luminescent layers each of which is interposed between the upper electrode and the lower electrode and emits red, green, or blue light; a glass substrate provided above the upper electrode; a lens sheet interposed between the pixel units and the glass substrate and having (i) lenses each provided for a corresponding one of the pixel units and (ii) a base on which the lenses are formed to protrude from the base; a sealing layer interposed between the upper electrode and the lens sheet, and is for sealing the pixel units; and partitions at least higher than a height of the lenses, which are provided between the glass substrate and the lens sheet, to partition lenses corresponding to the pixel units which emit light in different colors, in which the lens sheet includes trenches (i) formed along a perimeter of a region in the base, in which the lenses are formed, and (ii) recessed from a surface of the base in a direction opposite to a protruding direction of the lenses, the partitions are inserted into the trenches on the lens sheet, and at least peripheral surfaces of portions of the partitions inserted into the trenches are black.

According to the present invention, in the organic EL display panel apparatus according to the present invention, partitions inserted into the trenches of the lens sheet provided between the sealing layer and the glass substrate absorbs the stray light, and prevents the stray light from entering the adjacent luminescent area. Furthermore, external light entered from outside and light reflected at the interface between the glass substrate and the bonding layer, and the interface between the glass substrate and air can be absorbed by the partitions. As such, preventing the color mixture in the adjacent luminescent area allows provision of the organic EL display apparatus capable of displaying bright colors and a manufacturing method of the organic EL display apparatus.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Furthermore, the luminescent part including the luminescent layer of the organic EL panel is susceptible to the effect of air and surrounding substances, and is unstable and likely to be transformed. For this reason, it is necessary to block that contact with outside by providing a sealing layer between the luminescent part and the lens layer. Forming the sealing layer expands the path of light from the luminescent part to the layer including the lens layer, and the increase in the number of interfaces between the sealing layer and the layers above and below the sealing layer increase the rate of reflection and scattering of the emitted light. As a result, due to the expanded path of light from the luminescent portion to the lens layer for providing the sealing layer between the luminescent portion and the lens layer, the reflected light and the scattered light generated at the interfaces between the sealing layer and the layers above and below the sealing layer becomes stray light inside the panel, causing a problem of the stray light entering into the adjacent luminescent area.

Note that, in order to prevent the reduction in sheet resistivity of a common light-transmissive electrode across the display, a technique for patterning the conductive layer in contact with the light-transmissive electrode has been disclosed (see Patent Literature 1: Japanese Unexamined Patent Application Publication (Translation of PCT Application) No. 2009-510696, paragraph [0021], and FIG. 2)

Figure 18:
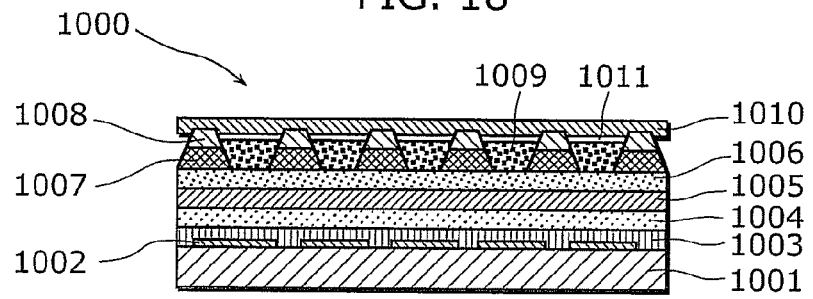
FIG. 18 is a cross-section of a conventional display panel apparatus disclosed in Patent Literature 1.

FIG. 18 is a cross-section of the conventional display panel apparatus disclosed in Patent Literature 1.

As illustrated in FIG. 18, in the conventional display panel apparatus (OLED display) 1000, an insulating layer 1008 is patterned on a conductive layer 1007, and a conductive layer structure is formed by the conductive layer 1007 and the insulating layer 1008. The conductive layer structure partitions wells. The wells are aligned with the light-emitting units of the organic LED (OLED) device. Although Patent Literature 1 does not directly related to the abovementioned problem, it is mentioned that the conductive layer 1007 and the insulating layer 1008 may serve as a light-absorbing material (see paragraphs [0025] to [0027]).

However, in the conventional display panel apparatus, on the luminescent part formed by the common light-transmissive electrode 1006, the electron-transporting layer 1005, the light-emitting layer 1004, the hole-transporting layer 1003, and the bottom electrode 1002 on the substrate 1001, the light-transmissive cover 1010 is formed interposing the optical material (light-scattering material) 1009 and the gap 1011. In addition, the optical material 1009 is partitioned by the conductive layer structure. The conductive layer 1007 composing the conductive layer structure supplies current to the common light-transmissive electrode 1006 in order to prevent the reduction in the sheet resistivity of the common light-transmissive electrode 1006. Thus, in the conventional display panel apparatus, the common light-transmissive electrode 1006 and the conductive layer 1007 cannot be separately formed. Thus, in the conventional display panel apparatus, the optical material 1009 partitioned by the conductive layer 1007 cannot be formed separate from the common light-transmissive electrode 1006. As a result, according to the conventional display panel apparatus, due to the expansion in the optical path from the luminescent portion and the lens layer due to the presence of the sealing layer between the luminescent part and the lens layer, the reflected light and the scattered light generated at the interfaces between the sealing layer and the layers above and below the sealing layers becomes stray light inside the panel, failing to solve the problem of light entering the adjacent luminescent area.

The present invention has been conceived in view of the problem, and it is an object of the present invention to provide a display panel apparatus and its manufacturing method which prevents the stray light inside the panel caused by the reflected light and the scattered light generated at the interfaces between the sealing layer and the layers above and below the sealing layers due to the expansion of the optical path from the luminescent part and the lens layer when the sealing layer is provided between the luminescent part and the lens layer from entering the adjacent luminescent area, and which allows bright-colored display.

A display panel apparatus according to an aspect of the present invention is a display panel apparatus including: pixel units having lower electrode, an upper electrode, and organic luminescent layers each of which is interposed between the upper electrode and the lower electrode and emits red, green, or blue light; a glass substrate provided above the upper electrode; a lens sheet interposed between the pixel units and the glass substrate and having (i) lenses each provided for a corresponding one of the pixel units and (ii) a base on which the lenses are formed to protrude from the base; a sealing layer interposed between the upper electrode and the lens sheet, and is for sealing the pixel units; and partitions at least higher than a height of the lenses, which are provided between the glass substrate and the lens sheet, to partition lenses corresponding to the pixel units which emit light in different colors, in which the lens sheet includes trenches (i) formed along a perimeter of a region in the base, in which the lenses are formed, and (ii) recessed from a surface of the base in a direction opposite to a protruding direction of the lenses, the partitions are inserted into the trenches on the lens sheet, and at least peripheral surfaces of portions of the partitions inserted into the trenches are black.

According to this aspect, the partitions are provided between the glass substrate and the lens sheet such that the height of the partitions is at least higher than the height of the lenses, and the partitions partition the pixel units emitting light in different colors. With this, the partitions can block the light emitted from the pixel unit corresponding to one color and completely reflected on the glass substrate traveling to the pixel unit corresponding to another color adjacent to the pixel unit. Thus, it is possible to significantly suppress the light emitted from the pixel unit corresponding to the one color and completely reflected on the glass substrate from entering the pixel unit corresponding to another color.

Furthermore, according to this embodiment, the trenches recessed from the surface of the base in a direction opposite to the protruding direction of the lenses are formed along the perimeter of the region of the base in which the lenses are provided. Subsequently, as well as inserting the partitions into the trenches on the lens sheet, at least the peripheral surfaces of the partitions inserted into the trenches are black. With this, the stray light diffused in a direction of the pixel unit corresponding to another color from the upper electrode of the pixel unit corresponding to the one color and through the sealing layer can be absorbed by the tips of the partitions inserted in the trenches. Thus, it is possible to prevent the stray light from the upper electrode of the pixel unit corresponding to the one color from entering the pixel unit corresponding to another color.

Furthermore, the tips of the partitions absorb the external light entering from outside of the display panel apparatus through the glass substrate. With this, the tips of the partitions serve as a black matrix used as one of conventional color filters, thereby suppressing the external light entering from outside of the display panel apparatus reaching the pixel units. Thus, it is possible to prevent the external light from reflecting on the transparent electrode and exiting to outside, thereby improving the contract of image.

As described above, the partitions provided between the lenses are capable of performing three functions in one; namely, for blocking the reflected light from the glass substrate, for absorbing the stray light emitted from the organic luminescent layer included in the pixel unit corresponding to the one color, and for absorbing the external light. Therefore, it is not necessary for independently provide a part for each function, thereby reducing the number of parts of the display panel apparatus and allowing the organic EL device to be thinner as much as the reduced parts. Consequently, it is possible to reduce the cost for manufacturing the display panel apparatus and to improve the light-extraction efficiency.

In a display panel apparatus according to an aspect of the present invention, each of tips of the partitions inserted into the trenches on the lens sheet absorbs the light (i) emitted from an organic luminescent layer included in a pixel unit partitioned by the partitions and corresponding to one color and (ii) traveling to another pixel unit corresponding to another color and adjacent to the pixel unit corresponding to the one color.

When the lenses are directly arranged on the upper electrode of the pixel units, the upper electrode and the lens sheet are closely attached. Thus, there is not stray light from the upper electrode of the pixel unit corresponding to the one color diffused to a direction of the pixel unit corresponding to another color. The light emitted from the pixel unit corresponding to the one color is emitted between the partitions above the pixel unit corresponding to the one color. Therefore, no color mixture occurs due to the stray light emitted from the pixel unit of one color in the pixel unit corresponding to the other color in this case.

However, when there is a predetermined layer such as the sealing layer for sealing the pixel units exists between the upper electrode and the lens sheet, there is a distance between the lens sheet and the pixel unit as much as the thickness of the sealing layer interposed between the upper electrode and the lens sheet.

Thus, the light emitted from the pixel unit corresponding to the one color is diffused to a direction of the pixel unit corresponding to the pixel unit corresponding to another color adjacent to the pixel unit corresponding to the one color, from the upper electrode of the pixel unit corresponding to the one color through the sealing layer. As a result, the diffused light enters the pixel unit corresponding to the other color as the stray light, causing the color mixture in the pixel unit corresponding to the other color.

According to this aspect, the tips of the partitions inserted into the trenches of the lens sheet absorb light emitted from the organic luminescent layer included in the pixel unit corresponding to the one color and traveling toward the pixel unit corresponding to the other color adjacent to the pixel unit corresponding to the one color. With this, it is possible to suppress the stray light entering the pixel unit corresponding to the other color through the sealing layer interposed between the pixel units and the lens sheet. Thus, it is possible to suppress the color mixture generated in the pixel unit corresponding to the other color.

In addition, as described above, when the lens sheet is directly placed on the upper electrode of the pixel units, no color mixture due to the stray light occurs in the pixel unit corresponding to the other color. However, the sealing layer for sealing the pixel units may only be placed above the lens sheet. Thus, there is a possibility of moisture and outgases such as oxygen entering the pixel units after the pixel units are formed and before the sealing layer is formed above the lens sheet. In this aspect, the sealing layer is formed after forming the pixel units and before placing the lens sheet. Thus, compared to the case where the sealing layer is arranged above the lens sheet, it is possible to block moisture and the outgases such as oxygen entering the pixel unit immediately.

More specifically, according to this aspect, it is possible to suppress the stray light entering the pixel unit corresponding to the other color while interposing the sealing layer between the pixel units and the lens sheet. Thus, it is possible to suppress the stray light entering the pixel unit corresponding to the other color while preventing the outgases from entering the pixel units.

In a display panel apparatus according to an aspect of the present invention, a bottom surface of each of the partitions inserted into each of the trenches is flat, and the black peripheral surfaces inserted into the trenches include black bottom surfaces of the partitions.

When the bottom surfaces of the partitions inserted into the trenches are flat, the stray light diffused toward the pixel unit corresponding to the other color is completely reflected on the bottom surfaces of the partitions if the flat surface is not black. As a result, the stray light completely reflected on the bottom surfaces of the partitions enter the pixel unit corresponding to the other color, causing the color mixture in the pixel unit corresponding to the other color.

In this aspect, the bottom surfaces of the partitions inserted into the trenches are flat, and the flat surfaces are black. This allows the bottom surfaces of the partitions to absorb the stray light diffused toward the pixel unit corresponding to the other color, thereby preventing the stray light from reflecting on the bottom surfaces of the partitions. As a result, the color mixture in the pixel unit corresponding to the other color can be more effectively suppressed.

In a display panel apparatus according to an aspect of the present invention, tips of the partitions inserted into the trenches are pointed toward the pixel units, and the black peripheral surfaces inserted into the trenches include black side surfaces of pointed tips.

According to this aspect, the tips of the partitions inserted into the trenches are pointed toward the pixel units, and side surfaces of the protruding tips are black. As such, the side surfaces of the tips of the partitions inserted into the trenches absorb the stray light of the light emitted from the pixel unit corresponding to the one color.

In a display panel apparatus according to an aspect of the present invention, a ratio of a distance from a lower surface of the lens sheet to the organic luminescent layers included in the pixel units to a distance from the lower surface of the lens sheet to a lower surface of the glass substrate is in a range from 1:1 to 1:8.

The longer the distance from the lens sheet to the pixel units with respect to the distance from the lens sheet to the glass substrate; that is, the thicker the sealing layer, the amount of stray light diffused toward the pixel unit corresponding to the other color through the sealing layer increases. Thus, the range is determined to be in a range from 1:1 to 1:8 in this embodiment. More specifically, the distance between the lens sheet and the pixel units are set to be shorter than the distance between the lens sheet and the glass substrate. With this, the thickness of the sealing layer interposed between the lens sheet and the pixel units is thin enough with respect to the distance from the lens sheet to the glass substrate. Thus, it is possible to reduce the amount of stray light from the upper electrode of the pixel unit corresponding to the one color to the pixel unit corresponding to the other color through the sealing layer as much as the reduction in distance.

In a display panel apparatus according to an aspect of the present invention, the partitions are formed between lenses and within a predetermined range from an end of a region in which the lenses are formed.

According to this aspect, the partitions are formed between the lenses and within a predetermined range from the end of the region in which the lenses are formed.

In a display panel apparatus according to an aspect of the present invention, the partitions are formed within a range between 0 μm and 54 μm inclusive from the end of the region in which the lenses are formed.

The partitions are formed within a range between 0 μm and 54 μm inclusive from the end of the region in which the lenses are formed.

In a display panel apparatus according to an aspect of the present invention, side surfaces of the partitions are black, and the partitions absorb light the light (i) emitted from an organic luminescent layer included in a pixel unit partitioned by the partitions and corresponding to one color, (ii) reflected on the glass substrate, and (iii) traveling to another pixel unit corresponding to another color and adjacent to the pixel unit corresponding to one color.

The light emitted form the pixel unit corresponding to the one color is completely reflected on the glass substrate, according to the angle of incidence to the glass substrate. As a result, the light emitted from the organic luminescent layer included in the pixel unit corresponding to one color enters the pixel unit corresponding to the other color adjacent to the pixel unit corresponding to the one color, causing the color mixture in the pixel unit corresponding to the other color.

According to this aspect, the side surfaces of the partitions are black The partitions absorb the light reflected on the glass substrate and traveling toward the pixel unit corresponding to the other color adjacent to the pixel unit corresponding to the one color. With this, it is possible to suppress the light reflected on the glass substrate and traveling toward the luminescent region of the pixel unit corresponding to the other color, thereby suppressing the color mixture generated in the pixel unit corresponding to the other color. Thus, it is possible to improve the contrast in the display image.

In addition, since it is not necessary to provide a black matrix as a separate material for absorbing the light leaking to the pixel unit corresponding to the other color adjacent to the pixel unit corresponding to the one color, it is possible to make the organic EL device thinner as much as the black matrix. As a result, it is possible to improve the light-extraction efficiency of the display panel apparatus.

In a display panel apparatus according to an aspect of the present invention, the partitions further absorb light entering the pixel unit from outside of the display panel apparatus through the glass substrate.

According to this aspect, the partitions absorb external light entering from outside of the display panel apparatus through the glass substrate. Thus, the partitions serve as the black matrix used for part of conventional color filters, thereby blocking the external light entering from outside of the display panel apparatus from reaching the adjacent pixel unit. Thus, it is possible to suppress the external light reflected on the transparent electrode exiting to outside. As a result, it is possible to improve the contrast of the image.

Furthermore, it is not necessary to provide a black matrix as a separate material for absorbing the external light. Thus, the thickness of the organic EL device can be thinner as much as the black matrix.

In a display panel apparatus according to an aspect of the present invention, the partitions at least may extend from the base and may be in contact with the glass substrate.

According to this aspect, the partitions are provided in contact with the glass substrate. With this, the partitions completely block between the glass substrate and the base. Thus, it is possible to securely block the light completely reflected on the glass substrate traveling toward the pixel unit adjacent to the pixel unit corresponding to the one color.

Furthermore, conventionally, the shape of the lenses collapses when only supported by the base because the base is very thin compared to the lenses; it is difficult for only the base to support the shape of the lenses. For this reason, the base material for reinforcing the base is provided conventionally at the lower surface of the base. However, the larger the number of layers between the glass substrate and the pixel unit, the amount of light emitted from the organic luminescent layer in the pixel unit through the glass substrate decreases, suppressing the light-extraction efficiency.

According to this aspect, the base and the glass substrate is connected by the partitions. Thus, the lens sheet is fixed by the partitions and the glass substrate. Thus, it is possible to reduce the base material conventionally provided at the lower surface of the lens sheet, and can reduce the layers between the glass substrate and the pixel unit as much as the base material. Consequently, more light emitted from the organic luminescent layer in the pixel unit can be extracted compared to the conventional technology, thereby improving the light-extraction efficiency.

In a display panel apparatus according to an aspect of the present invention, the trenches may penetrate the lens sheet, and the partitions may be inserted into the trenches on the lens sheet and penetrate the lens sheet.

According to this embodiment, the trenches penetrate the lens sheet, and the partitions penetrate the lens sheet. Thus, the part of the partitions inserted into the trenches increases, thereby absorbing more stray light to the pixel unit adjacent to the pixel unit corresponding to the one color as much as the increase.

In addition, penetrating the partitions through the base securely fixes the lens sheet and the glass substrate via the partitions. Thus, it is not necessary to provide the base material under the lens sheet, allowing the reduction of the layers between the glass substrate and the pixel unit as much as the base material. Consequently, more light emitted from the organic luminescent layer in the pixel unit can be extracted compared to the conventional technology, thereby improving the light-extraction efficiency.

In a display panel apparatus according to an aspect of the present invention, the partitions may penetrate through a bottom surface of the base when a thickness of the base is between 5 µm and 20 µm inclusive, and a distance from the organic luminescent layers to a bottom surface of the lens sheet is 2 µm or more.

According to this aspect, when the thickness of the base is between 5 µm and 20 µm inclusive, and the distance from the organic luminescent layer to the bottom surface of the lens sheet is 2 µm or more, the partitions penetrate through the bottom surface of the base.

With this, the partitions penetrate the base at a depth for blocking the light reflected on the glass substrate most. Thus, it is possible to most suitably block the light emitted from the organic luminescent layer included in the pixel unit partitioned by the partitions, from reflected on the glass substrate and traveling toward the pixel unit adjacent to the pixel unit. Therefore, it is possible to improve the contrast on the display image highly accurately.

In a display panel apparatus according to an aspect of the present invention, each of the partitions in cross-section may have an upper side shorter than a bottom side and tilted sides.

According to this aspect, the cross-sectional shape of the partitions has an upper side shorter than the bottom side and tilted side. This allows the partitions to be stably held.

In a display panel apparatus according to an aspect of the present invention, each of the partitions in cross-section may have an upper side longer than a bottom side and tilted sides.

This makes the cross-sectional shape of the partitions has the upper side longer than the bottom side and tilted sides In a display panel apparatus according to an aspect of the present invention, the pixel units may include organic luminescent layers along a predetermined direction, which emit light in a same color, and the partitions partition lenses corresponding to the pixel units which emit light in different colors along the predetermined direction.

According to this embodiment, the lenses are provided to cover the pixel units which emit light in the same color, and the partitions partition, along the predetermined direction, the lenses corresponding to the pixel unit emitting the light in different colors.

In a display panel apparatus according to an aspect of the present invention, each of the lenses is elongated in top view and has an elliptic arc shape with a predetermined curvature factor in cross-section orthogonal to a longitudinal direction of the lens.

According to this aspect, the lens is elongated in top view and has an elliptic arc shape with the predetermined curvature factor in cross-section orthogonal to a longitudinal direction of the lens.

In a display panel apparatus according to an aspect of the present invention, the pixel units may be arranged in a grid, and the partitions may be provided between the lenses in a vertical direction and a horizontal direction of the grid.

According to this aspect, the pixel units are provided in the grid, and the partitions are provided between the lenses in a vertical direction and a horizontal direction of the grid.

A display panel apparatus according to an aspect of the present invention may include a bonding layer which planarizes irregularity formed over the lenses and bonds the lens sheet and the glass substrate, and a refractive index of the bonding layer may be smaller than refractive indices of the lenses.

According to this aspect, the bonding layer for bonding the lens sheet and the glass substrate is provided between the lens sheet and the glass substrate.

In a display panel apparatus according to an aspect of the present invention, the glass substrate composes an outer surface of the display panel apparatus.

According to this aspect, the glass substrate may compose an outer surface of the display panel apparatus.

A display panel apparatus according to an aspect of the present invention includes the display panel apparatus further including a hole injection layer which injects holes into the organic luminescent layer, the hole injection layer being provided between the organic luminescent layer and the lower electrode.

According to this aspect, the hole injection layer which injects holes into the organic luminescent layer is included between the organic luminescent layer and the lower electrode.

A display apparatus according to an aspect of the present invention includes the display panel apparatus.

A manufacturing method of a display panel apparatus according to an aspect of the present invention includes a first process of preparing pixel units having lower electrode, an upper electrode, and organic luminescent layers each of which is interposed between the upper electrode and the lower electrode and emits red, green, or blue light; a second process of forming, above the upper electrode, a sealing layer for sealing the pixel units; a third process of preparing a lens sheet having (i) lenses each provided for a corresponding one of the pixel units, (ii) a base on which the lenses are formed to protrude from the base, and (iii) a base material for reinforcing the base on a side of the base opposite to the side on which the lenses are provided; a fourth process of forming, on a glass substrate, partitions to partition the lenses; a fifth process of forming trenches along a perimeter of a region in the base, in which the lenses are formed, such that the trenches are recessed from a surface of the base in a direction opposite to a protruding direction of the lenses; a sixth process of placing the partitions by inserting the partitions formed on the glass substrate into the trench, such that a height of the partitions is at least higher than a height of the lenses; a seventh process of bonding the lens sheet and the glass substrate by injecting adhesive between the lens sheet and the glass substrate; an eighth process of removing the base material from the lens sheet; and a ninth process of bonding the sealing layer and the lens sheet by injecting adhesive above the sealing layer, in which at least peripheral surfaces of portions of the partitions inserted into the trenches are black.

Conventionally, the shape of the lenses collapses when only supported by the base because the base is very thin compared to the lenses; it is difficult for only the base to support the shape of the lenses. For this reason, the base material for reinforcing the base is provided conventionally at the lower surface of the base. However, the larger the number of layers between the glass substrate and the pixel unit, the amount of light emitted from the organic luminescent layer in the pixel unit through the glass substrate decreases, suppressing the light-extraction efficiency.

According to this aspect, after connecting the lens sheet and the glass substrate through the partitions and the bonding layer, the base material is removed. With this, the lens sheet is fixed by the partitions and the glass substrate. Thus, the shape of the lenses is maintained after the base material is removed. This allows the base material to be removed from the lens sheet, thereby reducing the number of layers between the glass substrate and the pixel unit as much as the base material. Consequently, the display panel apparatus manufactured by the manufacturing process allows more light emitted from the organic luminescent layer in the pixel unit to be extracted than the conventional technology, thereby improving the light-extraction efficiency.

In a manufacturing method of a display panel apparatus according to an aspect of the present invention, in which the fifth process is for penetrating the trenches to form holes between the lenses through which the partitions penetrate.

According to this aspect, the partitions may be provided to penetrate the base. With this, in the manufacturing process of the display panel apparatus, when forming the partitions on the lens sheet to penetrate the base, not only the partitions are bonded with the upper surface of the base but also penetrates the base to be held, thereby allowing the partitions to be stably held between the lenses.

The following describes the display panel apparatus and the manufacturing method of the display panel apparatus with reference to the drawings. Needless to say, the present invention is not limited to the following embodiments. In addition, the diagrams are schematic diagrams for explanation, and the ratios of thickness and the dimension of each component is not always strictly accurate.

First Embodiment

Figure 1:
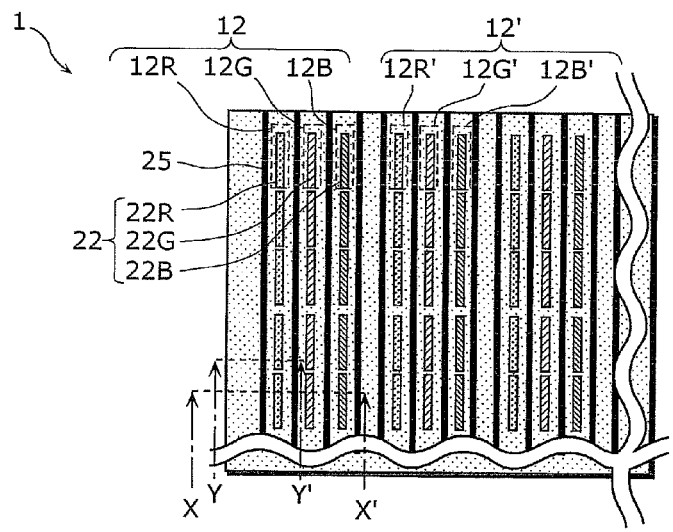
FIG. 1 is a planar view of a display panel apparatus according to the first embodiment of the present invention.

First, the following describes the display panel apparatus according to the first embodiment of the present invention. FIG. 1 is a planar view of the display panel apparatus according to the first embodiment of the present invention. Note that, for the purpose of description, the glass substrate 24 which is the uppermost layer and the bonding layer 27 are not illustrated.

As illustrated in FIG. 1, the display panel apparatus 1 according to the first embodiment of the present invention includes luminescent regions formed in a row direction and a column direction orthogonal to the row direction, that is, in a matrix. Each of the luminescent regions includes a luminescent pixel unit (hereafter simply referred to as "pixel unit") 12 for each luminescent region. As such, the pixel units 12 are arranged in a row direction and a column direction which is orthogonal to the row direction, according to the luminescent regions, that is, in a matrix. The pixel units 12 include a pixel unit 12R which emits red light (hereafter referred to as "red pixel unit", a pixel unit 12G which emits green light (hereafter referred to as "green pixel unit"), and a pixel unit 12B (hereafter referred to as "blue pixel unit") which emits blue light. Hereafter, for the purpose of description, when the sign R is attached to the reference numeral for the name of each component, the component belongs to the red luminescent region. Similarly, when the sign G is attached, the component belongs to the green luminescent region, and when the sign B is attached, the component belongs to the blue luminescent region.

As such, the pixel units 12 which emit light in three colors are arranged such that the pixel units which emit the light in the same color are repeatedly arranged in the column direction in stripes. In the row direction, the red pixel units 12R, the green pixel units 12G, and the blue pixel units 12B are repeatedly arranged in this order. The luminescent regions include the red pixel units 12R, the green pixel units 12G, and the blue pixel units 12B and emit light. The luminescent region corresponding to the red pixel unit 12R is a red luminescent region, the luminescent region corresponding to the green pixel unit 12G is a green luminescent region, and a luminescent region corresponding to the blue pixel unit 12B is a blue luminescent region. In addition, the region between the blue pixel unit 12B and the next red pixel unit 12R' is a non-luminescent region where the pixel unit 12 is not formed and there is no luminescent light.

The lens 22 is formed for each of the pixel units 12 corresponding to the pixel units 12. The lens 22 is for converging light emitted from the organic luminescent layers in the red pixel unit 12R, the green pixel unit 12G, and the blue pixel unit 12B. Note that the lens for the red pixel unit 12R is referred to as lens for red 22R, lens for the green pixel unit 12G is referred to as lens for green 22G, and lens for the blue pixel unit 12B is referred to as lens for blue 22B.

Furthermore, partitions 25 are provided between the lenses 22 each of which corresponds to each pixel unit 12. The partitions 25 are provided such that the light in different color does not enter adjacent luminescent regions in row direction. More specifically, the partitions 25 are provided between the lens for red 22R and the lens for green 22G, and between the lens for green 22G and the lens for blue 22B. In other words, the first partitions 25 are provided on both sides of the lens 22 such that the lens for red 22R, the lens for green 22G, and the lens for blue 22B are interposed.

As such, the pixel units include organic luminescent layer 11 each emits the light in the same color along a predetermined direction, and the partitions 25 partition lenses, along the predetermined direction, corresponding to the pixel units emitting the light in different color.

In this embodiment, the lenses are provided to cover the pixel units along a predetermined direction which emit the light in the same color, and the partitions 25 partition the lenses corresponding to pixel units which emit the light in different color.

Note that, in this embodiment, the lens 22 is arranged corresponding to one of the pixel units 12 as illustrated in FIG. 1. Lenticular lens may also be used as a shared lens for the pixel units 12 of the same color formed in the column direction.

Figure 2:
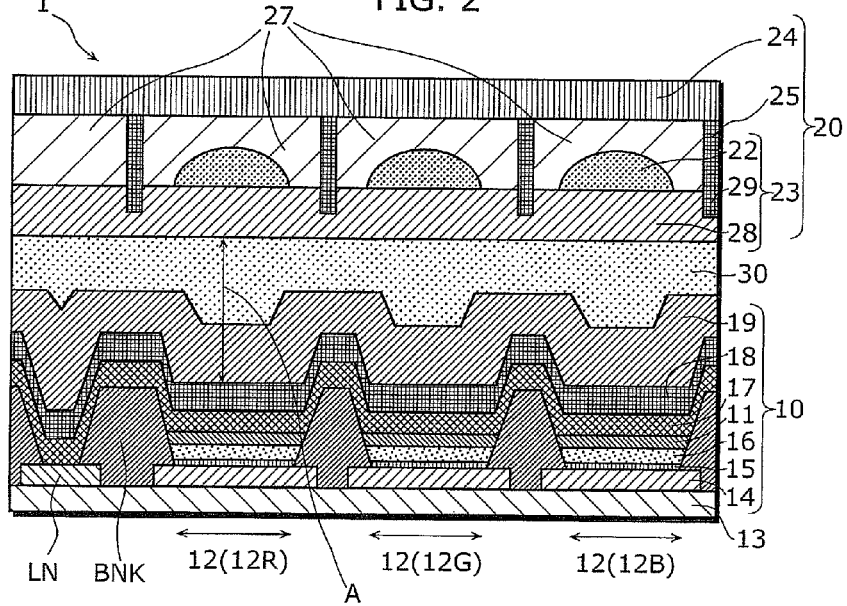
FIG. 2 is a cross-section of the display panel apparatus according to the first embodiment of the present invention along the line X-X' illustrated in FIG. 1.

The following specifically described the positional relationship between the lenses 22 and the partitions 25 with reference to FIG. 2. FIG. 2 is a cross-section of the display panel apparatus according to the first embodiment of the present invention along the line X-X' illustrated in FIG. 1.

As shown in FIG. 2, the display panel apparatus 1 according to the first embodiment of the present invention has the organic EL unit 10 and the lens unit 20 bonded by a sealing resin 30.

The organic EL unit 10 includes, for each pixel unit 12R, 12G, and 12B, a first electrode 14 (lower electrode), a hole injection layer 15, an intermediate layer 16, an organic luminescent layer 11, an electron transport layer 17, a second electrode 18 (upper electrode) and a sealing thin-film 19 that are sequentially formed in this order on the substrate 13 on which the planarizing film (not illustrated) is formed.

The substrate 13 on which the planarizing film is formed includes a Thin-Film Transistor (hereafter referred to as TFT) layer (not illustrated) formed on the substrate 13 and the planarizing film for planarizing the top surface of the TFT layer.

The first electrode 14 may be a repeller that serves as an anode, and each portion the first electrode 14 is separately formed for each pixel unit. More specifically, a portion of the first electrode 14 is formed for each of the red pixel units 12R, the green pixel units 12G and the blue pixel units 12B.

The hole injection layer 15 is capable of facilitating injection of holes into the intermediate layer 16, and is made of a predetermined organic material. In addition, the intermediate layer 16 is capable of facilitating injection of holes to the organic luminescent layer 11, and is made of a predetermined organic material. The hole injection layer 15 and the intermediate layer 16 are separately formed for each pixel unit.

The organic luminescent layer 11 which emits predetermined light, includes an organic luminescent layer 11R which emits red light (hereafter referred to as "red organic luminescent layer"), an organic luminescent layer 11G which emits green light (hereafter referred to as "green organic luminescent layer"), and an organic luminescent layer 11B which emits blue light (hereafter referred to as "blue organic luminescent layer"). In addition, the red organic luminescent layer 11R, the green organic luminescent layer 11G, and the blue organic luminescent layer 11B are included in the red pixel unit 12R, the green pixel unit 12G, and the blue pixel unit 12B, respectively. Note that, the pixel units 12 in the organic EL unit 10 includes the first electrode 14 and the second electrode 18, and the organic luminescent layers, that is, a red organic luminescent layer 11R, a green organic luminescent layer 11G and a blue organic luminescent layer 11B are interposed between the first electrode 14 and the second electrode 18.

The organic luminescent layer 11 in each pixel unit 12 is made of an organic material with a predetermined electroluminescent property. The organic luminescent layer 11 is separately formed for each pixel unit 12, and as described above, includes a red organic luminescent layer 11R, a green organic luminescent layer 11G and a blue organic luminescent layer 11B are provided for the red pixel unit 12R, the green pixel unit 12G, and the blue pixel unit 12B, respectively.

The electron transport layer 17 is capable of facilitating the transport of electrons to the organic luminescent layer 11, and is made of a predetermined organic material.

The second electrode 18 is a transparent electrode that serves as a cathode, and may be made of conductive material such as indium tin oxide (ITO), facing the first electrode 14. The second electrode 18 is shared by the pixel units 12.

The sealing thin-film 19 and sealing resin 30 on the sealing thin-film 19 is a sealing layer for sealing the organic EL unit 10, and is made of thin-film transparent insulating material. The organic material having the electroluminescent property included in the organic luminescent layer 11 is easily altered or degraded due to the influence of moisture and oxygen. Thus, it is important to seal the organic EL unit 10 to keep the moisture and oxygen out of the organic EL unit 10.

Note that, banks BNK for partitioning the first electrodes 14, the hole injection layer 15, the intermediate layer 16, and the organic luminescent layer 11 for each pixel units 12 are provided between the pixel units 12R, 12G, and 12B. The banks BNK are made of photosensitive resin, for example. Lines LN are arranged on the substrate 13 in the non-luminescent region in which the organic luminescent layer 11 is not formed.

The lens unit 20 includes the lens sheet 23 including the lenses 22 and the glass substrate 24 (cover plate). The lens unit 20 further includes the partitions 25. A bonding layer 27 is formed between the lens sheet 23 and the glass substrate 24.

The lens sheet 23 interposed between the pixel unit 12 (organic EL unit 10) and the glass substrate 24, has lenses 22 and a base 28 on which the protruding lenses 22 are formed. The lens sheet 23 is formed with a sheet-shaped base 28 and the lenses 22 made of acrylic resin such as polymethylmethacrylate resin (metacrylate resin) on one surface of the base 28. The lenses 22 are formed to correspond to all of the pixel units 12R, 12G, and 12B, respectively, and one lens 22 is formed for one pixel unit 12. More specifically, the lens for red 22R is formed for the red pixel unit 12R, the lens for green 22G and the lens for blue 22B are formed for the green pixel unit 12G and the blue pixel unit 12B, respectively. The lenses 22R, 22G, and 22B in the pixel units 12R, 12G, and 12B allow condensing the light emitted from the organic luminescent layers 11R, 11G, and 11B. This increases the light-extraction efficiency.

Note that the cross-section of the lens 22 has an elliptic arc shape having a predetermined curvature factor as shown in FIG. 2. The shape of the lenses 22 in a planar view is rectangular and elongated in the column direction as illustrated in FIG. 1. Thus, the lens 22 has a semi-cylinder shape. Note that, in this embodiment, the lens 22 is arranged corresponding to one of the pixel units 12 as illustrated in FIG. 1. Lenticular lens may also be used as a shared lens for the pixel units 12 of the same color formed in the column direction.

The glass substrate 24 is arranged at the uppermost layer of the lens unit 20. In addition, the glass substrate 24 constitutes the external surface of the display panel apparatus 1, and the light emitted from the organic luminescent layer 11 in each pixel unit 12 is radiated outside the display panel apparatus 1 through the glass substrate 24.

The bonding layer 27 is formed over lenses, and is for planarizing the irregularity due to the lenses 22 and bonding the lens sheet 23 and the glass substrate 24. The refractive index of the bonding layer 27 is smaller than the refractive index of the lenses.

The partitions 25 for partitioning the lenses provided for the pixel units 12 are arranged on a side of the lens sheet 23 on which the lenses 22 are formed. The partitions 25 are arranged between the lens sheet 23 and the glass substrate 24, and in this embodiment, the top of the partitions 25 on the glass substrate side contacts the glass substrate 24. Thus, the height of the partitions 25 from the base of the lens sheet 23 is higher than the lens 22.

The bottom of the partitions 25 on the base side the lens sheet 23 is buried in the trench 29. At least the peripheral surfaces of the partition 25 inserted into the trench 29 is black. The trenches 29 are recessed from the surface of the base 28 in a direction opposite to the protruding direction of the lens 22. The trenches 29 are formed along the perimeter of a region in the base 28 where the lenses 22 are provided. More specifically, in a planar view of the display panel apparatus 1, the trenches 29 are arranged in stripes with respect to a part of the perimeter along the column direction of the lenses 22 in the base 28 in the region where the lenses are formed.

In this embodiment, the sealing thin-film 19 and the sealing resin 30 are provided between the organic EL unit 10 and the lens unit 20. Thus, the optical path (distance A in FIG. 2) from the second electrode 18 (upper electrode) to the base 28 of the lens sheet 23 becomes longer as much as the interposing sealing thin-film 19 and the sealing resin 30. For this reason, the reflected light generated at the interface of the sealing thin-film 19 and the sealing resin 30 and the layers above and below, and the scattered light generated by scattering in each layer between the organic luminescent layer 11 and the base 28 of the lens sheet 23 become stray light inside of the panel and enter the adjacent pixel unit 12. As such, the stray light in different color is emitted from the adjacent pixel unit, causing a problem of lowered contrast of the image.

In order to solve this problem, the partitions 25 are provided between the lenses 22 corresponding to the pixel units 12 as described above. More specifically, the partitions 25 are provided on both sides of the lenses 22 such that the lens for red 22R, the lens for green 22G, and the lens for blue 22B are interposed.

Figure 3:
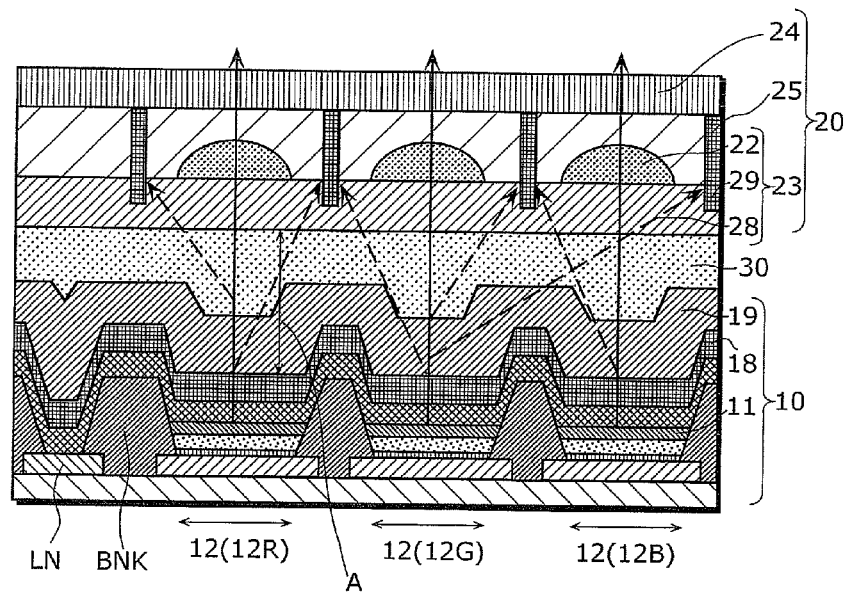
FIG. 3 illustrates light emitted from the organic luminescent layer traveling in the display panel apparatus according to the first embodiment of the present invention.

The following specifically describes the function of the partitions 25 with reference to FIG. 3. FIG. 3 schematically illustrates the cross-section of the display panel apparatus according to the first embodiment, in which the partitions 25 absorb the light emitted from the organic luminescent layer and prevents the stray light.

As illustrated in FIG. 3, due to the distance A from the upper electrode 18 to the base 28 of the lens sheet 23, the light emitted from the organic luminescent layer 11 scatters at the upper electrode 18, the sealing thin-film 19, and the sealing resin 30 of the pixel unit corresponding to one color, and becomes the stray light (broken line arrow in FIG. 3) traveling to the pixel unit in another color.

Here, the trenches 29 are recessed from the surface of the base 28 in a direction opposite to the protruding direction of the lens 22, along the perimeter of the region of the base 28 of the lens sheet 23 where the lenses 22 are provided. The partitions 25 are inserted into the trenches 29 of the lens sheet 23, and at least the peripheral surface of the partitions 25 inserted into the trenches 29 is black.} This allows the tips of the partitions 25 inserted into the trenches 29 to absorb the stray light. Thus, it is possible to suppress the stray light entering the pixel unit 12 corresponding to another color from the upper electrode 18 of the pixel unit corresponding to one color. On the other hand, the light which does not travel to the direction of the pixel unit corresponding to another color (solid line arrows in FIG. 3) transmits the glass substrate 24 from the pixel unit corresponding to the color and emitted to outside.

As in the conventional technology, when the lenses are arranged on the upper electrode of the pixel units, the upper electrode and the lens sheet are closely attached. Thus, no stray light diffused from the upper electrode of the pixel unit corresponding to one color to the direction of the pixel unit corresponding to another color, and the light emitted from the pixel unit corresponding to one color is emitted above the pixel unit corresponding to the one color and between the partitions. Therefore, no color mixture occurs due to the stray light emitted from the pixel unit of one color in the pixel unit corresponding to the other color in this case.

However, as in this embodiment, when the sealing thin-film 19 and the sealing resin 30 for sealing the pixel units 12 are interposed between the second electrode 18 and the lens sheet 23, for example, there is the distance A between the lens sheet 23 and the pixel unit 12 as much as the thickness of the sealing thin-film 19 and the sealing resin 30 interposed between the second electrode 18 and the lens sheet 23, for example.

Thus, the light emitted from the pixel unit corresponding to one color is diffused to the direction of the pixel unit corresponding to the other color adjacent to the pixel unit corresponding to the one color, from the upper electrode 18 of the pixel unit in the one color through the sealing thin-film 19 and the sealing resin 30 due to the distance A. As a result, the diffused light enters the pixel unit corresponding to the other color as the stray light, causing the color mixture in the pixel unit corresponding to the other color.

According to this embodiment, the tip of the partitions 25 inserted into the trenches 29 of the lens sheet 23 absorbs the light emitted from the organic luminescent layer 11 in the pixel unit corresponding to one color and traveling to the pixel unit corresponding to the other color adjacent to the pixel unit corresponding to the one color. This allows to suppress the stray light entering the pixel unit corresponding to the other color through the sealing thin-film 19 and the sealing resin 30 interposed between the pixel units 12 and the lens sheet 23. Thus, it is possible to suppress the color mixture in the pixel unit corresponding to the other color.

In addition, as described in the conventional technology, when the lens sheet is provided directly on the upper electrode of the pixel unit, no color mixture due to stray light occurs in the pixel unit corresponding to the other color. However, the sealing layer for sealing the pixel unit can only be arranged above the lens sheet. Thus, there is a possibility of the moisture and outgas such as oxygen entering the pixel units after forming the pixel units and before forming the sealing layer above lens sheet. In this embodiment, the sealing thin-film 19 and the sealing resin 30 are formed after forming the pixel units and before placing the lens sheet 23. Thus, compared to the case where the sealing layer is provided above the lens sheet, the entering of the moisture and the outgas such as oxygen to the pixel units can be blocked immediately.

More specifically, according to this embodiment, it is possible to suppress the stray light entering the pixel unit corresponding to the other color while interposing the sealing thin-film 19 and the sealing resin 30 between the pixel units 12 and the lens sheet 23. Thus, it is possible to prevent the outgas from entering the pixel unit 12 and suppress the stray light entering the pixel units corresponding to the other color.

Note that, the bottom surface of the partitions 25 inserted into the trenches 29 may also be flat. In addition, at least the peripheral surface of the partitions 25 inserted into the trenches 29 is black includes a case where the bottom of the partitions 25 is black.

When the bottom of the partitions 25 inserted into the trenches 29 is flat, if the flat surface is not black, the stray light diffused to the pixel unit corresponding to the other color reflects on the bottom surface of the partitions 25. As a result, the stray light reflected on the bottom of the partitions 25 enters the pixel unit corresponding to the other color, causing the color mixture in the pixel unit in the other color. More specifically, having the bottom of the partitions 25 inserted into the trenches 29 to be flat and the having the flat surface in black allows absorbing the stray light diffused to the pixel unit corresponding to another color at the bottom of the partitions 25. Thus, this prevents the stray light from reflecting on the bottom of the partitions 25. As a result, the color mixture in the pixel unit corresponding to the other color can be more effectively suppressed.

Figure 4:
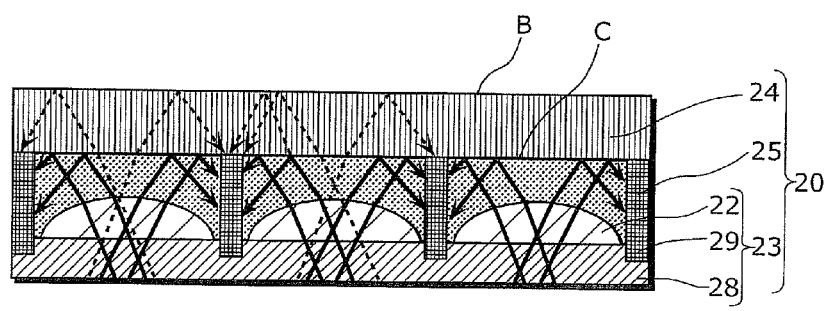
FIG. 4 is a cross-section illustrating the reflected light traveling in the lens unit of a display panel apparatus according to the first embodiment of the present invention.

The partitions 25 not only absorb stray light but also the reflected light generated in the interface B between the bonding layer 27 and the glass substrate 24 and the interface C between the glass substrate 24 and the outer air. The following specifically describes the function of the partitions 25 with reference to FIG. 4. FIG. 4 illustrates the traveling reflected light emitted from the organic luminescent layer 11 and reflected on the interface B between the bonding layer 27 and the glass substrate 24 or reflected on the interface C between the glass substrate 24 and the outer air in the cross-section of the lens unit 20 in the display panel apparatus according to the first embodiment of the present invention.

The light emitted from the organic luminescent layer 11 in the pixel unit corresponding to the one color reflects on the interface B between the bonding layer 27 and the glass substrate 24 according to the angle of incidence to the glass substrate 24. The light also reflects on the interface C between the glass substrate 24 and the outside air. As a result, the light emitted from the organic luminescent layer 11 included in the pixel unit corresponding to the one color enters the pixel unit corresponding the other color adjacent to the pixel unit corresponding to the one color, causing the color mixture in the pixel unit corresponding to the other color.

As illustrated in FIG. 4, in this embodiment, the partitions 25 are provided between the glass substrate 24 and the lens sheet 23 such that the height of the partitions 25 is at least higher than the height of the lenses 22. The partitions 25 partition the lenses corresponding to the pixel units which emit light in different colors. With this, the light emitted from the pixel unit corresponding to one color and reflected on the interface B between the bonding layer 27 and the glass substrate 24 (solid line arrows in FIG. 4) can be blocked by the partitions 25 provided between the lenses so as not to travel to the pixel unit corresponding to the pixel unit in the other color adjacent to the pixel unit corresponding to one color. The partitions 25 provided between lenses can also block the light reflected on the interface C between the glass substrate 24 and the outside air (dotted line arrows in FIG. 4) to travel to the pixel unit corresponding to the other color adjacent to the pixel unit in the one color. Thus, it is possible to significantly suppress the light emitted from the pixel unit corresponding to one color and reflected on the glass substrate entering the pixel unit corresponding to the other color.

Furthermore, in this embodiment, the side surfaces of the partitions 25 are black. The partitions 25 absorbs the light reflected on the interface B between the bonding layer 27 and the glass substrate 24 and traveling to the pixel unit corresponding to the other color adjacent to the pixel unit corresponding to the one color. The partitions 25 absorbs the light reflected on the interface C between the glass substrate 24 and the outside air and traveling to the pixel unit corresponding to the other color adjacent to the pixel unit corresponding to the one color. With this, it is possible to suppress the light reflected on the interface between the bonding layer 27 and the glass substrate 24 and traveling to the luminescent region of the pixel unit corresponding to the other color, thereby suppressing the color mixture in the pixel unit corresponding to the other color. Thus, it is possible to improve the contrast in the display image.

Furthermore, it is not necessary to provide separate material as black matrix for absorbing the light leakage to the pixel unit corresponding to the other color adjacent to the pixel unit corresponding to one color. Thus, it is possible to make the thickness of the entire organic EL panel thinner.

Figure 5:
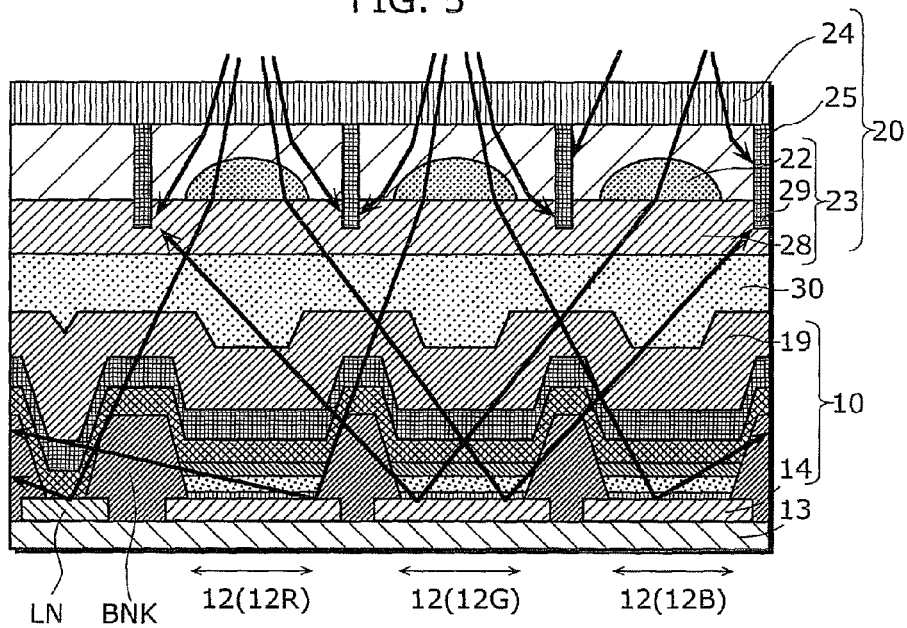
FIG. 5 is a cross-section illustrating the outside light traveling in the lens unit of a display panel apparatus according to the first embodiment of the present invention.

The partitions 25 absorb the outside light from outside the glass substrate 24. The following specifically describes the absorbing function of the partitions 25 with reference to FIG. 5. FIG. 5 illustrates the traveling outside light in the cross-section of the display panel apparatus according to the first embodiment of the present invention.

As illustrated in FIG. 5, the tip of the partition 25 absorbs the outside light (solid-line arrows in FIG. 5) entering from outside of the display panel apparatus through the glass substrate 24. With this, the tips of the partitions 25 serve as the black matrix conventionally used as a part of color filters, thereby suppressing the outside light entered from outside of the display panel apparatus reaching the pixel units. Thus, it is possible to suppress the outside light reflected on the surface of the repeller electrode which are the bottom electrodes 14 and the transparent electrode which is the upper electrode 18 and exiting to outside, thereby improving the contrast of the image.

As illustrated above, the partitions 25 provided between the lenses are capable of absorbing the stray light emitted from the organic luminescent layer 11 and generated at the sealing thin-film 19 due to scattering (FIG. 3), for example, blocking the reflected light from the glass substrate 24 (FIG. 4), and absorbing the outside light (FIG. 5) in one part. Therefore, it is possible to significantly improve the contrast ratio in the display image. In addition, it is not necessary to separately provide materials for the functions, thereby reducing the number of components for the display panel apparatus and reducing the thickness of the organic EL device. Therefore, it is possible to reduce the manufacturing cost for the display panel apparatus and to improve the light-extraction efficiency.

Note that, the partitions 25 in the display panel apparatus according to this embodiment may be extended at least from the base 28 and contact the glass substrate 24.

Figure 6:
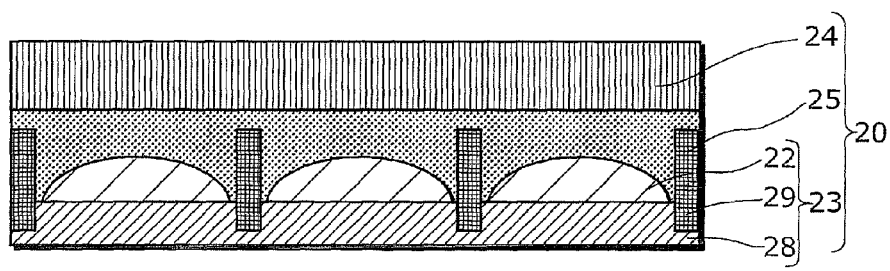
FIG. 6 is a cross-section illustrating the shape of partitions in the lens unit of a display panel apparatus according to the first embodiment of the present invention.

According to this embodiment, the partitions 25 are provided contacting the glass substrate 24. With this, the partitions 25 completely block the gap between the glass substrate 24 and the base 28. Thus, it is possible to securely block the light reflected on the interface between the glass substrate 24 and the bonding layer 27 traveling to the pixel unit adjacent to the pixel unit corresponding to the one color Note that, as illustrated in FIG. 6, the partitions 25 do not necessarily contact the glass substrate 24 in the lens unit 20. The partitions 25 may be formed apart from the glass substrate 24 in the lens unit 20 insofar as absorbing and blocking the reflected light from the glass substrate and the outside light.

Figure 7:
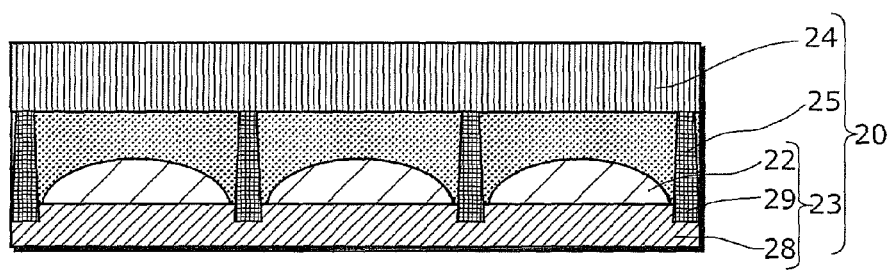
FIG. 7 is a cross-section illustrating the shape of partitions in the lens unit of a display panel apparatus according to the first embodiment of the present invention.
Figure 8:
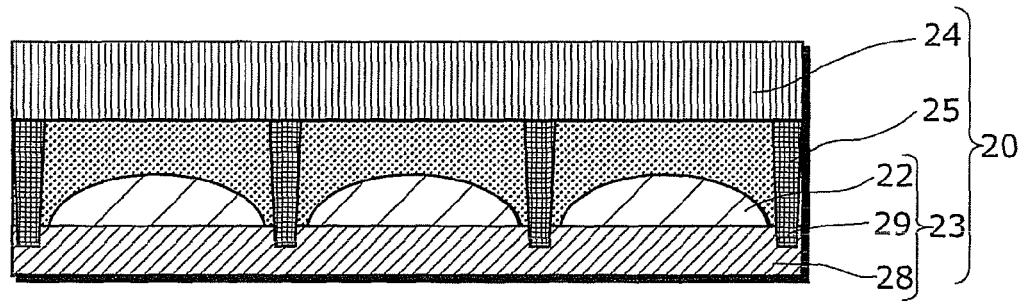
FIG. 8 is a cross-section illustrating the shape of partitions in the lens unit of a display panel apparatus according to the first embodiment of the present invention.
Figure 9:
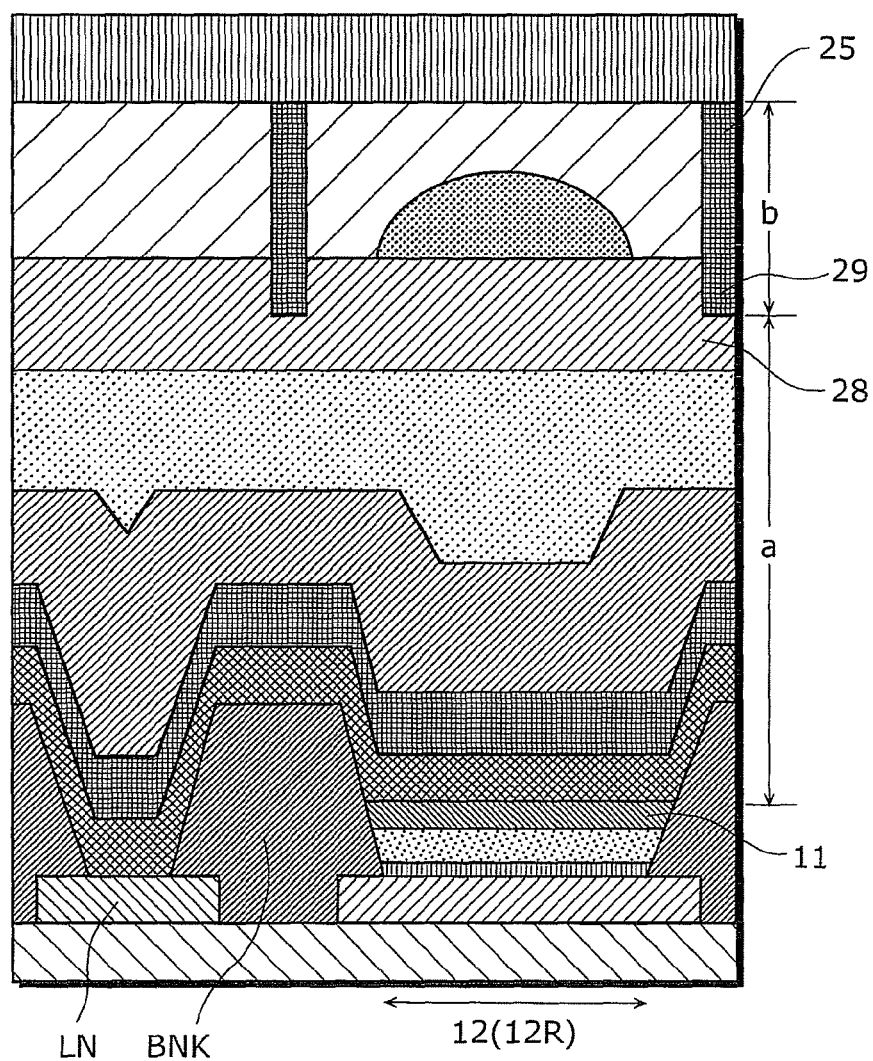
FIG. 9 is a cross-section illustrating dimensions of the partitions and the organic EL unit of a display panel apparatus according to the first embodiment of the present invention.

Note that, as illustrated in FIG. 7, the cross-sectional shape of the partitions 25 in-plane vertical direction of the display panel apparatus 1 may have an upper side shorter than the bottom side, and tilted sides This makes the cross-sectional shape of the partitions 25 to have the upper side shorter than the bottom side and tilted sides, allowing the partitions 25 to be stably held Note that, as illustrated in FIG. 8, the cross-sectional shape of the partitions 25 in-plane vertical direction of the display panel apparatus 1 may have an upper side longer than the bottom side, and tilted sides. This makes the cross-sectional shape of the partitions 25 to have the upper side longer than the bottom side and tilted sides The following describes an example of a suitable dimension of the partitions 25 for achieving the functions described above. FIG. 9 is a cross-section of the display panel apparatus according to the first embodiment of the present invention along the line Y-Y' in FIG. 1.

As illustrated in FIG. 9, the distance from the organic luminescent layer 11 included in the organic EL unit 10 to the lower surface of the partitions 25 buried in the base 28 of the lens sheet 23 included in the lens unit 20 is denoted as a. The distance from the lower surface of the partitions 25 buried in the base 28 of the lens sheet 23 included in the lens unit 20 to the upper surface of the partitions 25 is denoted as b. Providing the partitions 25 such that the ratio a:b, that is, the ratio of a to b in a range from 1:1 to 1:8, for example, is suitable for the partitions 25 in this embodiment to achieve the functions.

The larger the distance between the lens sheet 23 and the pixel units (organic EL unit 10) to the distance between the lens sheet 23 and the glass substrate 24, that is, the thicker the thickness of the sealing thin-film 19 and the sealing resin 30, the amount of stray light traveling to the pixel unit corresponding to the other color through the sealing thin-film 19 and the sealing resin 30 increases. Thus, the range is determined to be within 1:1 to 1:8 in this embodiment. More specifically, the distance between the lens sheet and the pixel units are decreased compared to the distance between the lens sheet and the glass substrate. With this, the thickness of the sealing thin-film 19 and the sealing resin 30 interposed between the lens sheet 23 and the pixel units is sufficiently thin compared to the distance between the lens sheet 23 and the glass substrate 24. Thus, it is possible to reduce the amount of the stray light traveling from the upper electrode 18 of the pixel unit corresponding to the one color to the pixel unit corresponding to the other color through the sealing thin-film 19 and the sealing resin 30.

Figure 10:
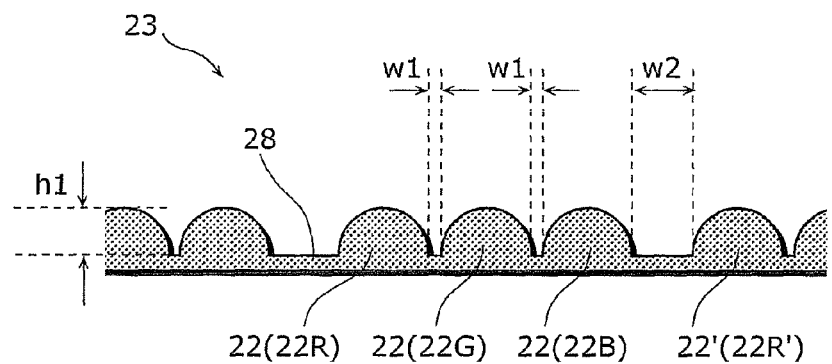
FIG. 10 illustrates dimensions of a lens sheet in the display panel apparatus according to the first embodiment of the present invention.

Next, the following describes an example of the dimension suitable for the lens sheet 23. FIG. 10 is a cross-section of the lens sheet 23 according to this embodiment.

As illustrated in FIG. 10, the lens sheet 23 includes the lenses 22 and the base 28. Each lens 22 may have a substantially same shape and a substantially same size. More specifically, the lens for red 22R, the lens for green 22G, and the lens for blue 22B may have a substantially same shape and a substantially same size. Note that, each lens 22 is formed only on one side of the base 28. In terms of the dimension of the lens 22 in this embodiment, the height of lens h1 may be 43 μm, for example. In addition, when the distance between the lens for red 22R and the lens for green 22G, and between the lens for green 22G and the lens for blue 22B is w1, w1 may be 3 μm, for example. Furthermore, the distance w2 of the non-luminescent region between the lens for blue 22B corresponding to the blue pixel unit 12B and the lens for red 22R' corresponding to the red pixel unit 12R' may be 54 μm, for example.

As described above, the lens sheet 23 includes the lenses 22 and the base 28. Each lens 22 is formed on the base 28 so as to compose the lens sheet 23 in one. Thus, the physical strength of the lens sheet 23 is determined by the thickness of the base 28. According to this embodiment, forming the trenches 29 on the base 28 of the lens sheet 23 and burying the partitions 25 in the trenches 29 increases the physical strength of the lens sheet 23, thinning the thickness of the base 28. As such, thinning the thickness of the base 28 of the lens sheet 23 improves the light-extraction efficiency in proportion to the thickness of the base 28 of the lens sheet 23. This point shall be described in detail with reference to a graph illustrating the relationship between the differences in thickness of the base 28 in FIG. 8 and the light-extraction efficiency to outside through the base 28.

Figure 11:
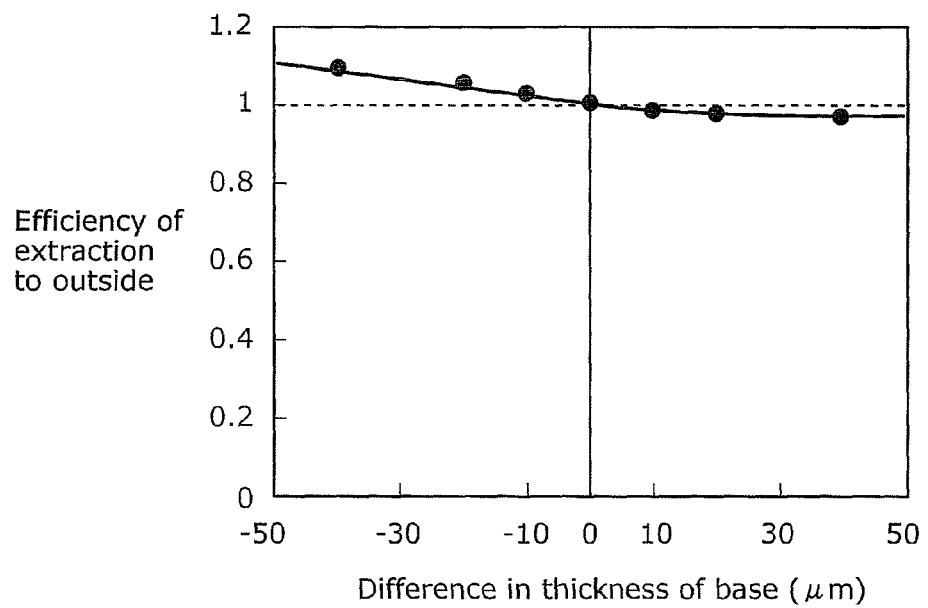
FIG. 11 is a graph illustrating the relationship between the difference in thickness of base film and the efficiency of extraction to outside in the display panel apparatus according to the first embodiment of the present invention.

FIG. 11 is a graph illustrating the change with respect to the increase and decrease of the thickness of the base 28 (the difference in the thickness of the base) with respect to a standard thickness in the light-extraction efficiency to outside (Efficiency of extraction to outside) through the base 28. The light-extraction efficiency to outside when the standard thickness of the base 28 of the lens sheet 23 is denoted as 0 is denoted as 1. FIG. 8 shows that when the difference in thickness of the base 28 is negative, that is, the thinner the film, the light-extraction efficiency to outside improves. This is because, when the light transmits a medium, the thicker the medium, the more likely the light hits the molecules in the medium, causing the light to be scattered. Accordingly, even in this embodiment, it is preferable that the thickness of the base 28 of the lens sheet 23 which is the optical path of the light emitted by the organic luminescent layer 11 to be as thin as possible.

As such, according to this embodiment, forming the trenches 29 on the base 28 of the lens sheet 23 and burying the partitions 25 in the trenches 29 reinforces the physical strength of the lens sheet 23, makes the thickness of the base 28 thinner, and improves the light-extraction efficiency to outside through the base 28.

Figure 12:
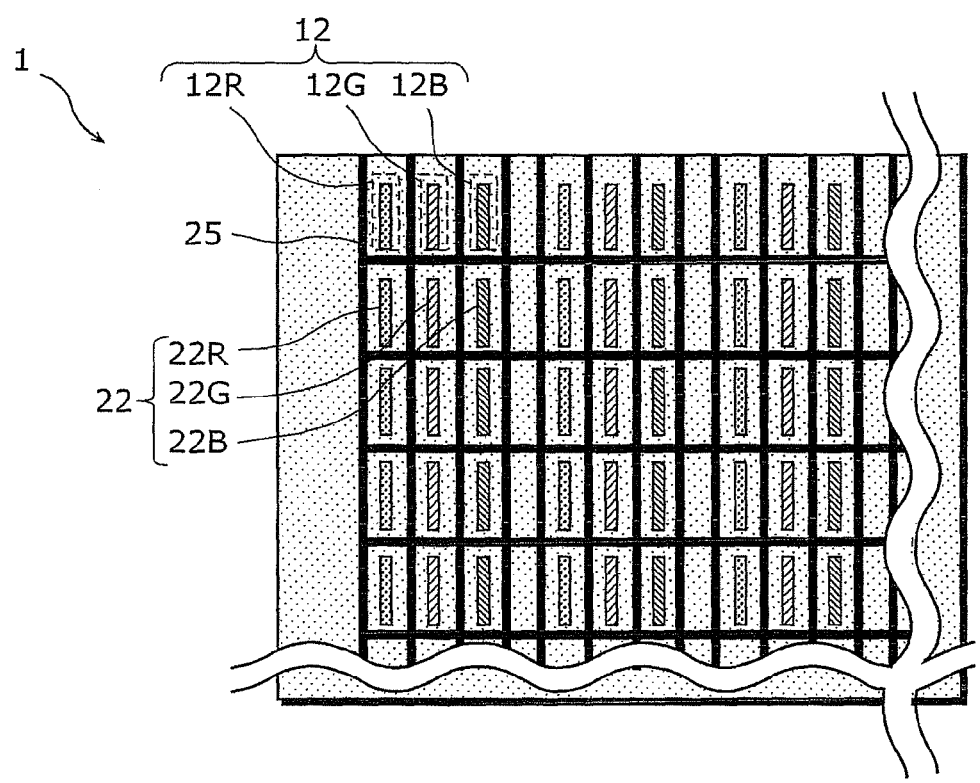
FIG. 12 is a planar view of a display panel apparatus according to the first embodiment of the present invention.

Note that, as illustrated in FIG. 12, the partitions 25 may be formed to surround each lens 22. To put it differently, the partitions 25 may be formed in grid. This allows blocking the stray light of the same color entering the adjacent different pixel in the column direction, between the pixels in the same color in the column direction. This clarifies the contrast display, improving the contrast ratio of the displayed image.

As such, according to this embodiment, forming the partitions 25 to surround each lens 22 clarifies the contrast display of the pixel, improving the contrast ratio of the displayed image.

Second Embodiment

Figure 13:
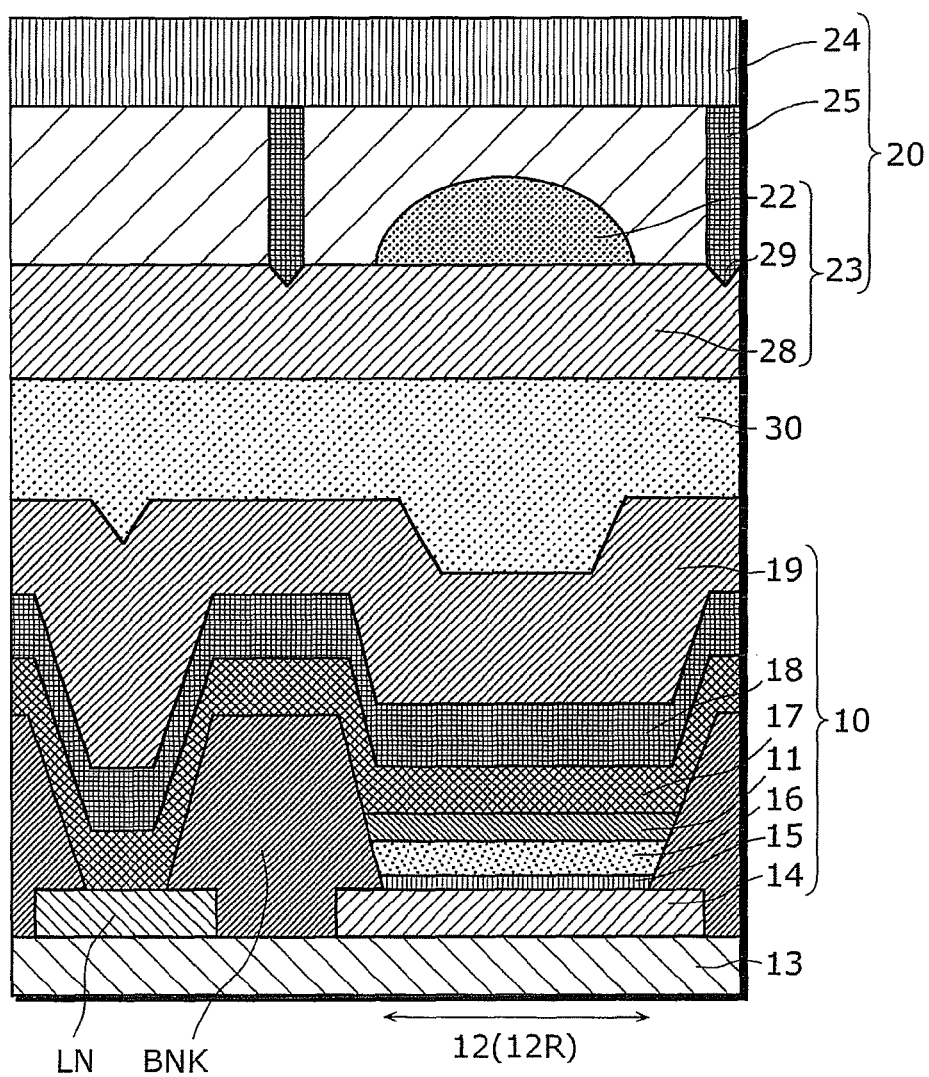
FIG. 13 is a partial cross-section of the display panel apparatus according to Variation 1 of the first embodiment.

Next, the following describes the display panel apparatus according to the second embodiment of the present invention with reference to FIG. 13. FIG. 13 is a partial enlarged cross-section view of a display panel apparatus according to Variation 1 of the first embodiment (second embodiment) of the present invention. Note that, the same reference numerals are applied to the same component as the display panel apparatus according to the first embodiment in FIG. 2, and the description for these components is omitted.

As illustrated in FIG. 13, the tips of the partitions 25 inserted into the trenches 29 is pointed toward the organic EL unit 10, and at least the peripheral surface and the side surfaces of the pointed tips inserted into the trenches 29 may be black In this case, the trenches 29 provided on the lens sheet 23 are formed to correspond to the shape of the tips of the partitions 25. The tips of the partitions 25 inserted into the trenches 29 protrude toward the organic EL unit 10, and the side surfaces of the pointed tips may be black. This allows the side surfaces of the tips of the partitions 25 inserted into the trenches 29 to absorb the stray light emitted from the pixel unit corresponding to the one color.

The light that enters the adjacent luminescent region through the base 28 of the lens sheet 23 is absorbed by the tips of the partitions 25 inserted into the lens sheet 23 and prevented from traveling. In addition, this structure keeps the shape of the lens sheet 26 maintained even if the strength of the lens sheet 23 is decreased due to the trenches 29.

Furthermore, having the tips of the partitions 25 protruding toward the organic EL unit 10 allows self alignment of the partitions 25 through the tips of the partitions 25 moving along the side surfaces of the trenches 29, when inserting the partitions 25 into the trenches 29 formed on the base 28 of the lens sheet 23. The process for inserting the partitions 25 into the trenches 29 shall be described later in detail.

Figure 14:
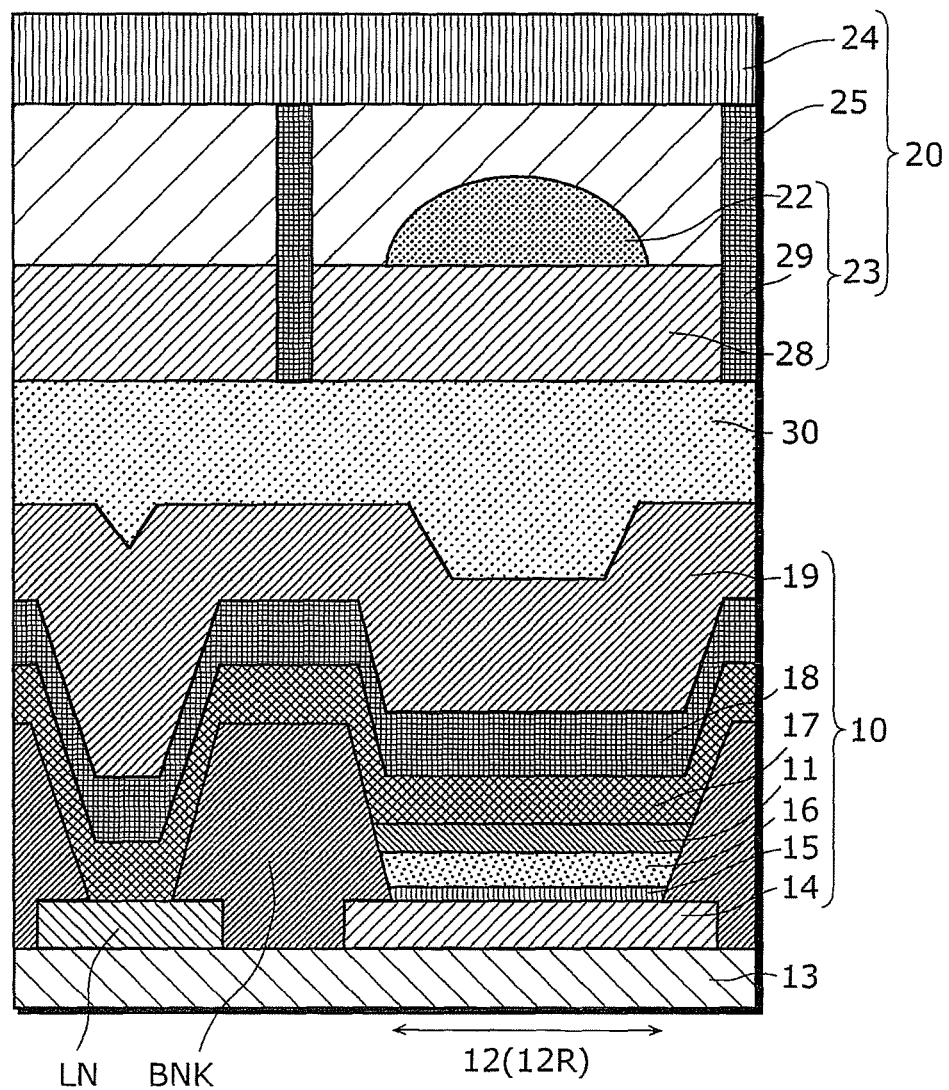
FIG. 14 is a partial cross-section of the display panel apparatus according to Variation 2 of the first embodiment.

As such, having the tips of the partitions 25 inserted into the trenches 29 pointed toward the organic EL unit 10, and having at least the peripheral surface and the side surfaces of the pointed tips inserted into the trenches 29 in black allows the tips of the partitions 25 to absorb the stray light and facilitates the manufacturing process for the display panel apparatus Third Embodiment Next, the following describes the display panel apparatus according to the third embodiment of the present invention with reference to FIG. 14. FIG. 14 is a partial enlarged cross-section view of a display panel apparatus according to Variation 2 of the first embodiment (third embodiment) of the present invention. Note that, the same reference numerals are assigned to the same component as the display panel apparatus according to the first embodiment in FIG. 2, and the description for these components is omitted.

As illustrated in FIG. 14, the trenches 29 passes through the lens sheet 23. The partitions 25 are inserted into the trenches, passing through the lens sheet 23.

According to this embodiment, the trenches 29 pass through the lens sheet 23, and the partitions 25 penetrate the lens sheet 23. This increases the region of the partitions 25 to be inserted into the trenches 29. Thus, it is possible to absorb more stray light to the pixel unit adjacent to the pixel unit corresponding to one color as much as the increase.

In addition, penetrating the partitions 25 into the base 28 stably fixes the lens sheet 23 and the glass substrate 24 via the partitions 25. With this, it is not necessary to provide base material under the lens sheet 23, and reduce the number of layers between the glass substrate 24 and the organic EL unit 10. Thus, more light emitted from the organic luminescent layer 11 of the organic EL unit 10, improving the light-extraction efficiency.

In addition, in the display panel apparatus according to an aspect of the present invention when the base 28 has the thickness between 5 μm and 20 μm inclusive, and the distance from the organic luminescent layer 11 to the bottom of the lens sheet 23 is equal to or more than 2 μm, the partitions 25 may penetrate the bottom of the base 28.

According to this embodiment, when the thickness of the base 28 is between 5 μm and 20 μm inclusive, and the distance from the organic luminescent layer 11 to the bottom of the lens sheet is 2 μm or more, the partitions 25 penetrate the bottom of the base 28.

According to this structure, the partitions 25 penetrate the base 28 at a depth which blocks the light reflected on the glass substrate 24 at a maximum. Thus, the partitions 25 can most appropriately block the light emitted from the organic luminescent layer 11 included in one pixel unit partitioned by the partitions 25 traveling to the pixel unit adjacent to the pixel unit due to the reflection on the glass substrate 24. Therefore, it is possible to improve the contrast on the display image at high accuracy.

(Manufacturing Method 1)

Next, the manufacturing method of the display panel apparatus 1 shall be described with reference to FIG. 15 and FIGS. 16A to 16I, using the display panel apparatus 1 according to the first embodiment of the present invention as an example.

Figure 15:
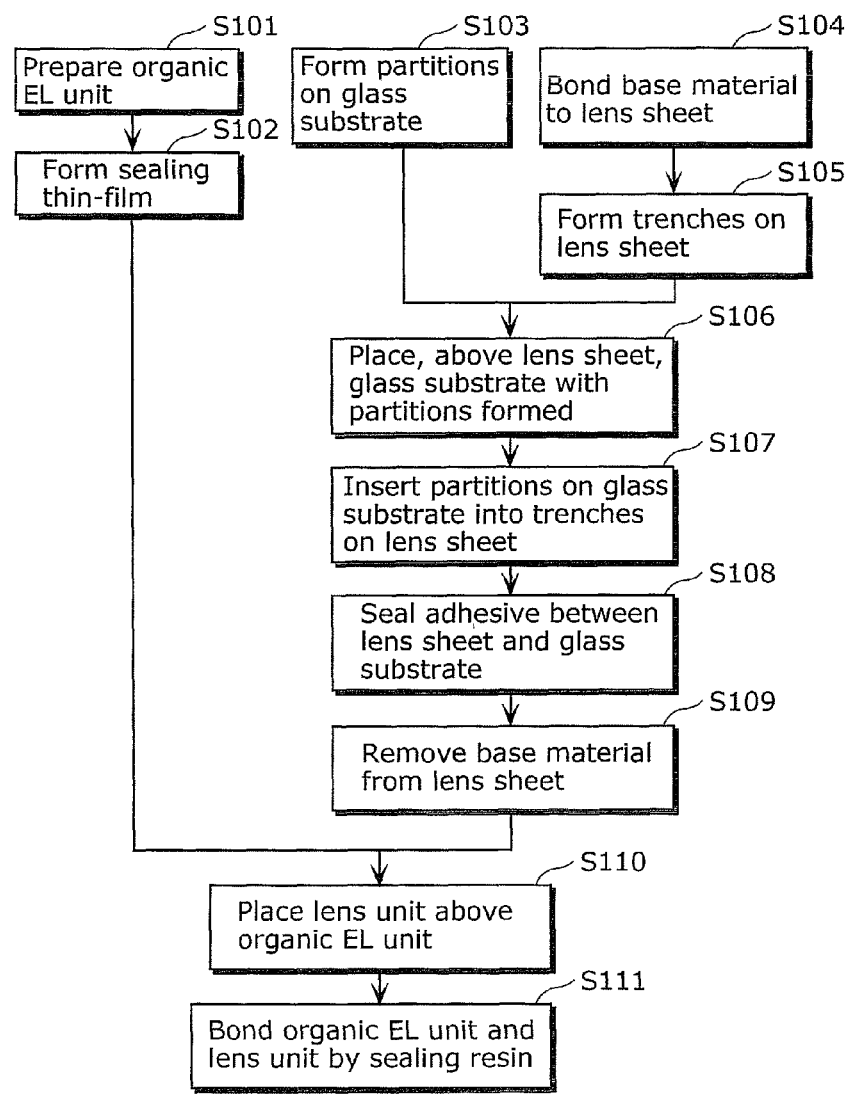
FIG. 15 is a flowchart illustrating a manufacturing method of a display panel apparatus according to the first embodiment of the present invention.

FIG. 15 is a flowchart of the manufacturing method 1 of a display panel apparatus according to the first embodiment of the present invention. FIGS. 16A to 16I are cross-sectional views of the components of the display panel apparatus in the processes of the manufacturing method 1 of the display panel apparatus according to the first embodiment.

As illustrated in FIG. 15, the organic EL unit 10 including the red organic luminescent layer 11R, the green organic luminescent layer 11G, and the blue organic luminescent layer 11B interposed between the first electrode 14 and the second electrode 18 are formed on the substrate 13 on which a TFT layer and the planarizing film for planarizing the surface of the TFT layer are formed (S101).

Next, the sealing thin-film 19 which serves as a sealing layer for sealing the organic EL unit 10 including the pixel units 12 is formed above the second electrode 18 (S102). With this, the organic EL unit 10 sealed by the sealing thin-film 19 is prepared.

Figure 16A:
FIG. 16A illustrates a process in step 103 in the manufacturing method of the display panel apparatus according to the first embodiment of the present invention.

Next, as illustrated in FIG. 15 and FIG. 16A, the partitions 25 are formed on the glass substrate 24 (S103).

Figure 16B:
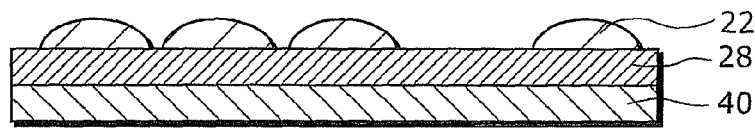
FIG. 16B illustrates a process in step 104 in the manufacturing method of the display panel apparatus according to the first embodiment of the present invention.

Next, as illustrated in FIG. 15 and FIG. 16B, in order to reinforce the base 28 of the lens sheet 23, a sheet-shaped base material 40 is bonded to a surface of the base 28 opposite to the side on which the lenses 22 are formed (S104). The lenses 22 of the lens sheet 23 are made of acrylic resin such as the polymethylmethacrylate resin (methacrylic resin). The base 28 of the lens sheet 23 is made of polyethylene terephthalate (PET). Note that, the base 28 may be made of the same material as the lens 22. Polycarbonate is used for the base material 40. Note that, the lenses 22 correspond to the pixel units 12 of the red luminescent region, the green luminescent region, and the blue luminescent region in this order from the left. The lens 22 is not present on the fourth region from the left because the region corresponds to the non-luminescent region.

Figure 16C:
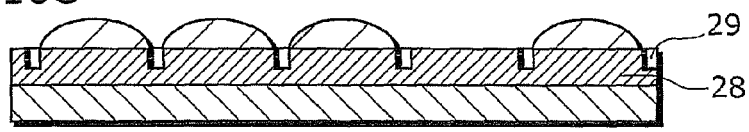
FIG. 16C illustrates a process in step 105 in the manufacturing method of the display panel apparatus according to the first embodiment of the present invention.

Next, as illustrated in FIG. 15 and FIG. 16C, on the surface of the base 28 of the lens sheet 23 where the lenses 22 are provided, trenches in a predetermined number are formed in stripe along the perimeter of the region in which the lenses 22 are provided (S105). The trenches 29 are formed to have a planar cross-section recessed from the surface of the base 28 in a direction opposite to the protruding direction of the lenses 22.

Figure 16D:
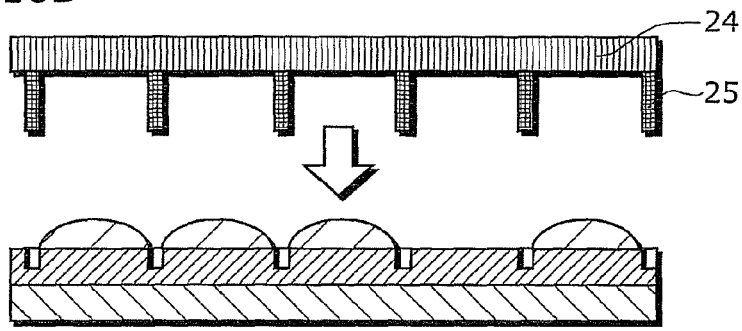
FIG. 16D illustrates a process in step 106 in the manufacturing method of the display panel apparatus according to the first embodiment of the present invention.

Next, as illustrated in FIG. 15 and FIG. 16D, the partitions 25 formed on the glass substrate 24 are placed immediately on the trenches 29 facing each other (S106).

Figure 16E:
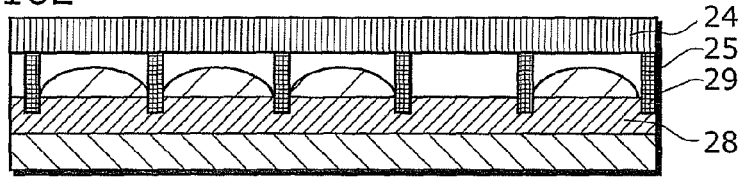
FIG. 16E illustrates a process in step 107 in the manufacturing method of the display panel apparatus according to the first embodiment of the present invention.

Next, as illustrated in FIG. 15 and FIG. 16E, the partitions 25 formed on the glass substrate 24 is inserted into the trenches 29 formed on the base 28 of the lens sheet 23 (S107).

Here, alignment marks may be added on the glass substrate 24 and the base material 40 to allow the partitions 25 to be placed immediately above the trenches 29 and inserted into the trenches 29. This allows the partitions 25 to be inserted aligned with the trenches 29.

Figure 16F:
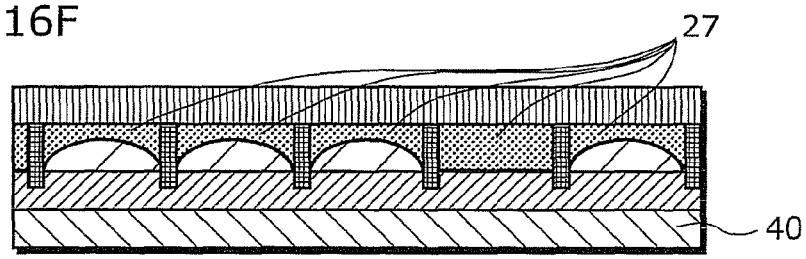
FIG. 16F illustrates a process in step 108 in the manufacturing method of the display panel apparatus according to the first embodiment of the present invention.

Next, as illustrated in FIG. 15 and FIG. 16F, adhesive is sealed between the lens sheet 23 and the glass substrate 24 for bonding the lens sheet 23 and the glass substrate 24 (S108). Here, the adhesive is injected pouring from the side, for example. The injected adhesive is filled between the lens sheet 23 and the glass substrate 24 by the capillary action. With this process, the bonding layer 27 is formed between the lens sheet 23 and the glass substrate 24.

Figure 16G:
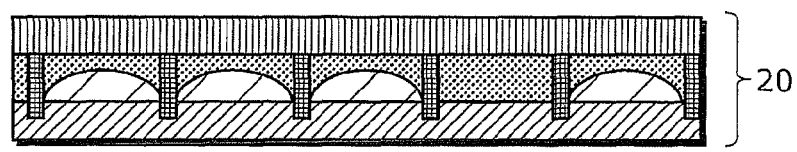
FIG. 16G illustrates a process in step 109 of the manufacturing method of the display panel apparatus according to the first embodiment of the present invention.

Next, as illustrated in FIG. 15 and FIG. 16G, the base material 40 is removed from the lens sheet 23 (S109). The lens unit 20 is completed with this process. The base material 40 is removed by dissolving the base material 40 using sodium peroxide. The combination of the base material 40 and the reagent for removing the base material 40 is not limited to this example as long as the base material 40 is properly removed without damaging the lens sheet 23 and others.

Figure 16H:
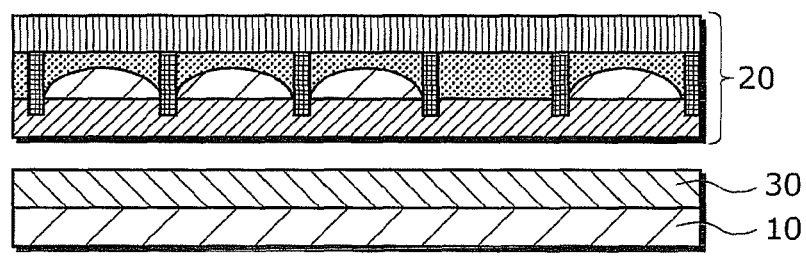
FIG. 16H illustrates a process in step 110 of the manufacturing method of the display panel apparatus according to the first embodiment of the present invention.

Next, as illustrated in FIG. 15 and FIG. 16H, the organic EL unit 10 prepared in step S101 and step S102, and the lens unit 20 completed in step S109 is placed above the organic EL unit 10 (S110).

Figure 16I:
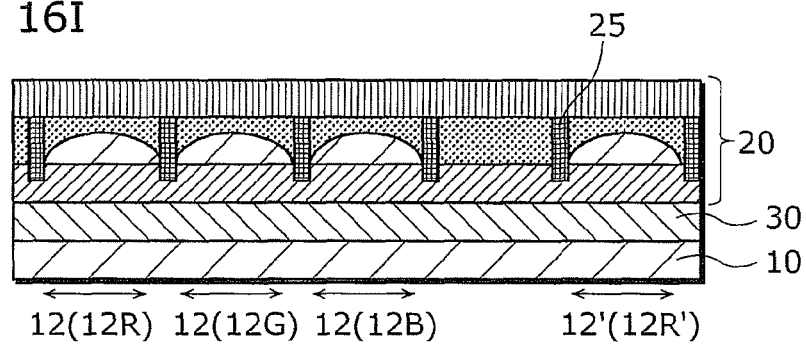
FIG. 16I illustrates a process in step 111 of the manufacturing method of the display panel apparatus according to the first embodiment of the present invention.

Next, as illustrated in FIG. 15 and FIG. 16I, the adhesive as the sealing resin 30 is injected above the sealing thin-film 19 on the organic EL unit 10 for bonding the sealing thin-film 19 and the base 28 of the lens sheet 23 (S111). With this, as illustrated in FIG. 16I, the organic EL unit 10 and the lens unit 20 are bonded by the sealing resin 30.

The display panel apparatus 1 according to this embodiment is completed by the processes described above.

As described above, in this embodiment, the partitions 25 are provided on the lens sheet 23 after the base material 40 for reinforcing the base 28 of the lens sheet 23 is provided on the base unit 28. Therefore, it is possible to prevent the distortion of the lens sheet 23 in the manufacturing process such as providing the partitions 25, preventing the degradation on the optical characteristic of the lens sheet 23 caused by the distortion of the lens sheet 23.

Furthermore, in this embodiment, the base material 40 is removed after connecting the lens sheet 23 and the glass substrate 25 through the partitions 25. With this, the lens sheet 23 is fixed with the glass substrate 24 through the partitions 25, allowing the lens sheet 23 to maintain its shape even after the base material 40 is removed. Therefore, it is not necessary for the display panel apparatus 1 manufactured according to the manufacturing method described in this embodiment to provide material such as the base material 40 for reinforcing the lens sheet 23 between the glass substrate 24 and the organic EL unit 10, thereby reducing the number of layers present between the glass substrate 24 and the organic EL unit 10. As a result, the display panel apparatus 1 capable of improving the light-extraction efficiency can be obtained.

Note that, the display panel apparatus according to the second embodiment of the present invention can be manufactured in the same manner as the manufacturing method described above. However, in the process in FIG. 16E, the tips of the partitions 25 protrude toward the organic EL unit 10. With this, when inserting the partitions 25 into the trenches 29 formed on the base 28 of the lens sheet 23, the tips of the partitions 25 moves along the sides of the trenches 29 to align by itself. This simplifies the manufacturing of the display panel apparatus.

Note that, the display panel apparatus according to the third embodiment of the present invention can be manufactured in the same manner as the manufacturing method described above. However, the partitions 25 in the process in FIG. 16C penetrates the base 28 of the lens sheet 23. More specifically, when forming the trenches 29, the trenches 29 are formed to pass through the base 28. Furthermore, in step S103 in FIG. 15, the height of the partitions 25 is adjusted to the depth of the trenches 29 at the time of forming. This allows the partitions 25 in the display panel apparatus according to the third embodiment to pass through the base 28 of the lens sheet 23.

Figure 17:
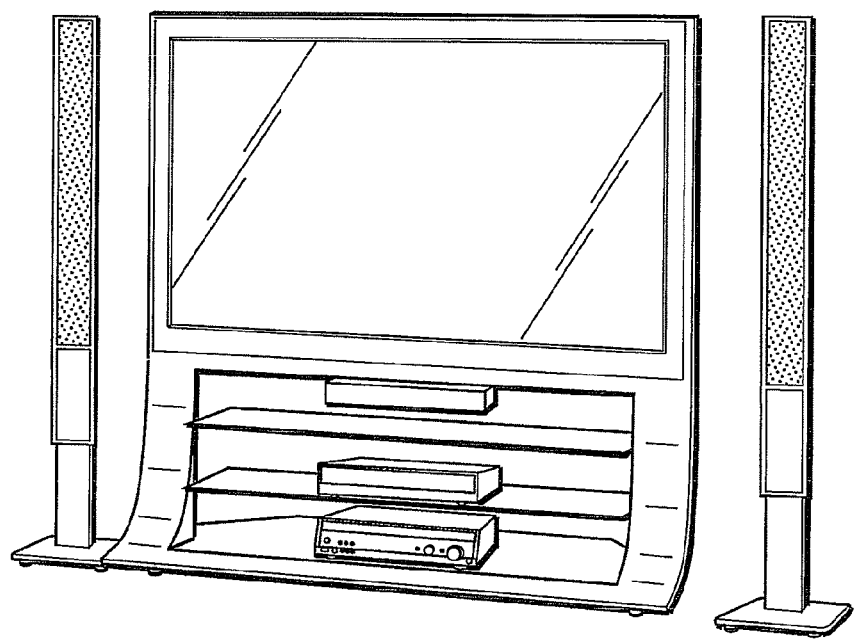
FIG. 17 is an external view of the display apparatus in which the display panel apparatus according to the first embodiment of the present invention is embedded.

As such, the display panel apparatus according to the embodiments of the present invention can be used as flat panel display, for example, and is applicable to all display devices in the television set illustrated in FIG. 17, mobile phones, personal computers, and others.

Although only some exemplary embodiments of the display panel apparatus and the manufacturing method of the display panel apparatus according to the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The display panel apparatus according to the present invention can be used as any display apparatus in television sets, mobile phones, and personal computers.

What is claimed is:

1. A display panel apparatus, comprising:
pixels, each including a lower electrode, an upper electrode, and an organic luminescent layer, the organic luminescent layer being between the upper electrode and the lower electrode and configured to emit one of a red, a green, and a blue light;
a glass substrate above the upper electrode of the pixels;
a lens sheet between the pixels and the glass substrate and including lenses and a base, each of the lenses corresponding to one of the pixels and protruding from the base;
a sealing layer between the upper electrode of the pixels and the lens sheet for sealing the pixels; and
partitions between the glass substrate and the lens sheet for partitioning the lenses that correspond to the pixels, the partitions having a first height greater than a second height of the lenses,
wherein the base of the lens sheet includes trenches between the lenses, the trenches being recessed from a surface of the base in a direction opposite a protruding direction of the lenses,
the partitions are in the trenches of the base of the lens sheet, and
the partitions each have a cross-section that includes an upper side that is shorter than a bottom side and lateral sides that are tilted.

2. The display panel apparatus according to claim 1, wherein at least portions of peripheral surfaces of the partitions that are in the trenches are black.

3. The display panel apparatus according to claim 1, wherein portions of the partitions that are in the trenches of the base of the lens sheet are configured to absorb the one of the red, green, and blue light emitted from the organic luminescent layer of a corresponding one of the pixels that is partitioned by the partitions and traveling to adjacent ones of the pixels.

4. The display panel apparatus according to claim 3, wherein a bottom surface of each of the partitions in each of the trenches is flat and black.

5. The display panel apparatus according to claim 3, wherein portions of the partitions that are in the trenches are pointed toward the pixels, and
the portions of the partitions that are pointed toward the pixels have side surfaces that are black.

6. The display panel apparatus according to claim 1, wherein a ratio of a first distance from a first lower surface of the lens sheet to the organic luminescent layers of the pixels to a second distance from the first lower surface of the lens sheet to a second lower surface of the glass substrate is in a range from 1:1 to 1:8.

7. The display panel apparatus according to claim 1, wherein the partitions are between the lenses and within a predetermined distance of the lenses.

8. The display panel apparatus according to claim 7, wherein the predetermined distance is at least 0 μm and at most 54 μm.

9. The display panel apparatus according to claim 1, wherein side surfaces of the partitions are black, and
the partitions are configured to absorb the one of the red, green, and blue emitted from the organic luminescent layer of a corresponding one of the pixels that is partitioned by the partitions, reflected from the glass substrate, and traveling to adjacent ones of the pixels.

10. The display panel apparatus according to claim 9, wherein the partitions are further configured to absorb light entering the pixels from outside of the display panel apparatus through the glass substrate.

11. The display panel apparatus according to claim 1, wherein the partitions at least extend from the base and are in contact with the glass substrate.

12. The display panel apparatus according to claim 1, wherein the trenches penetrate the lens sheet, and
the partitions are in the trenches and penetrate the lens sheet.

13. The display panel apparatus according to claim 12, wherein the partitions penetrate through a bottom surface of the base,
a thickness of the base is at least 5 μm and at most 20 μm, and
a distance from the organic luminescent layers to the bottom surface of the base is at least 2 μm.

14. The display panel apparatus according to claim 1, wherein the pixels include organic luminescent layers aligned in a predetermined direction that are configured to emit light in a same color, and
the partitions partition the lenses corresponding to the pixels that are configured to emit the light in the one of the red, green and blue light and aligned in the predetermined direction.

15. The display panel apparatus according to claim 14, wherein each lens of the lenses is elongated and has an elliptic arc shape with a predetermined curvature factor in a cross-section orthogonal to a longitudinal direction of the lens.

16. The display panel apparatus according to claim 14, further comprising:
a bonding layer between the lens sheet and the glass substrate for planarizing irregularities,
wherein a refractive index of the bonding layer is less than refractive indices of the lenses.

17. The display panel apparatus according to claim 1, wherein the pixels are arranged in a grid, and
the partitions are between the lenses in a vertical direction and a horizontal direction of the grid.

18. The display panel apparatus according to claim 1, wherein the glass substrate comprises an outer surface of the display panel apparatus.

19. The display panel apparatus according to claim 1, further comprising:
a hole injection layer between the organic luminescent layer and the lower electrode that is configured to inject holes into the organic luminescent layer.

20. A display apparatus, comprising:
the display panel apparatus according to claim 1.

21. A display panel apparatus, comprising:
pixels, each including a lower electrode, an upper electrode, and an organic luminescent layer, the organic luminescent layer being between the upper electrode and the lower electrode and configured to emit one of a red, a green, and a blue light;
a glass substrate above the upper electrode of the pixels;
a lens sheet between the pixels and the glass substrate and including lenses and a base, each of the lenses corresponding to one of the pixels and protruding from the base;
a sealing layer between the upper electrode of the pixels and the lens sheet for sealing the pixels; and
partitions between the glass substrate and the lens sheet for partitioning the lenses that correspond to the pixels, the partitions having a first height greater than a second height of the lenses,
wherein the base of the lens sheet includes trenches between the lenses, the trenches being recessed from a surface of the base in a direction opposite a protruding direction of the lenses,
the partitions are in the trenches of the base of the lens sheet, and
the partitions each have a cross-section that includes an upper side that is longer than a bottom side and lateral sides that are tilted.

22. The display panel apparatus according to claim 21, wherein at least portions of peripheral surfaces of the partitions that are in the trenches are black.

23. A manufacturing method of a display panel apparatus, comprising:
preparing pixels, each including a lower electrode, an upper electrode, and an organic luminescent layer, the organic luminescent layer being between the upper electrode and the lower electrode and configured to emit one of a red, a green, and a blue light;
forming a sealing layer above the upper electrode for sealing the pixels;
preparing a lens sheet including lenses, a base, and a base material, each of the lenses corresponding to one of the pixels and protruding from the base, the base material on a side of the base opposite the lenses for reinforcing the base;
forming partitions on a glass substrate for partitioning the lenses;
forming trenches between the lenses, the trenches being recessed from a surface of the base in a direction opposite a protruding direction of the lenses;
inserting the partitions formed on the glass substrate into the trenches, the partitions having a first height greater than a second height of the lenses;
bonding the lens sheet and the glass substrate by injecting a first adhesive between the lens sheet and the glass substrate;
removing the base material from the base of the lens sheet; and
bonding the sealing layer and the lens sheet by injecting a second adhesive above the sealing layer.

24. The manufacturing method of a display panel apparatus according to claim 23,
wherein at least portions of peripheral surfaces of the partitions that are inserted into the trenches are black.

25. The manufacturing method of a display panel apparatus according to claim 23,
wherein the trenches penetrate the base for forming through holes between the lenses through which the partitions penetrate.

* * * * *